(12) United States Patent
Chang et al.

(10) Patent No.: US 12,444,637 B2
(45) Date of Patent: Oct. 14, 2025

(54) SUBSTRATE FOR MANUFACTURING DISPLAY DEVICE AND A MANUFACTURING METHOD USING THE SAME

(71) Applicant: LG ELECTRONICS INC., Seoul (KR)

(72) Inventors: Jaewon Chang, Seoul (KR); Hyunho Lee, Seoul (KR); Soohyun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 380 days.

(21) Appl. No.: 17/798,219

(22) PCT Filed: Feb. 26, 2021

(86) PCT No.: PCT/KR2021/002468
§ 371 (c)(1),
(2) Date: Aug. 8, 2022

(87) PCT Pub. No.: WO2021/177673
PCT Pub. Date: Sep. 10, 2021

(65) Prior Publication Data
US 2023/0119947 A1    Apr. 20, 2023

(30) Foreign Application Priority Data

Mar. 2, 2020    (KR) .................... 10-2020-0026189

(51) Int. Cl.
*H01L 21/683*    (2006.01)
*H10H 20/01*    (2025.01)
*H10H 29/14*    (2025.01)

(52) U.S. Cl.
CPC ......... *H01L 21/6835* (2013.01); *H10H 20/01* (2025.01); *H10H 29/142* (2025.01);
(Continued)

(58) Field of Classification Search
CPC . H01L 21/6835; H01L 27/156; H01L 33/005; H01L 2221/68309;
(Continued)

(56) References Cited

U.S. PATENT DOCUMENTS 7,648,775 B2 * 1/2010 Wakako ............... H10H 20/856
428/668
8,097,896 B2 * 1/2012 Kim .................... H10H 20/8506
257/106
(Continued)

FOREIGN PATENT DOCUMENTS

KR    10-2017-0083191 A    7/2017
KR    10-2018-0007376 A    1/2018
(Continued)

*Primary Examiner* — Vu A Vu
(74) *Attorney, Agent, or Firm* — Birch, Stewart, Kolasch & Birch, LLP

(57) ABSTRACT

According to the present disclosure, a substrate for manufacturing a display device has a structure in which a semiconductor light-emitting device package composed of a plurality of electrodes and semiconductor light-emitting devices can be uniformly aligned. As a result, according to the present disclosure, a semiconductor light-emitting device package that has been transferred by a pick-and-place method in the related art may be allowed to be transferred through self-assembly, thereby having an effect of improving process efficiency (improving process speed and reducing time).

18 Claims, 12 Drawing Sheets

(52) U.S. Cl.
CPC ............... *H01L 2221/68309* (2013.01); *H01L 2221/68368* (2013.01); *H10H 20/032* (2025.01)

(58) Field of Classification Search
CPC ... H01L 2221/68368; H01L 2933/0016; H01L 33/0095; H01L 25/0753; H01L 33/62; H01L 21/67144; H01L 25/167; H01L 2224/95101; H01L 21/67721; H01L 33/20; H01L 33/38; H01L 33/486
USPC .......................................................... 438/106
See application file for complete search history.

(56) References Cited

U.S. PATENT DOCUMENTS

| | | | | |
|---|---|---|---|---|
| 8,129,742 | B2* | 3/2012 | Lin | .................. H01L 21/486 |
| | | | | 257/E23.102 |
| 8,704,433 | B2* | 4/2014 | Jung | .................. H10H 29/8325 |
| | | | | 313/46 |
| 9,196,805 | B2* | 11/2015 | Yamada | ............. H10H 20/8506 |
| 9,478,583 | B2* | 10/2016 | Hu | ........................ H10H 20/84 |
| 9,935,136 | B2* | 4/2018 | Chen | .................. H01L 21/6835 |
| 10,242,977 | B2* | 3/2019 | Sasaki | .................... H10H 29/14 |
| 10,270,021 | B2* | 4/2019 | Lee | .................... H10H 20/8582 |
| 10,672,946 | B2 | 6/2020 | Cho et al. | |
| 11,217,464 | B2* | 1/2022 | Ahn | .................... H01L 21/6838 |
| 11,894,350 | B2* | 2/2024 | Schuele | ................ H01L 24/95 |
| 2008/0258156 | A1* | 10/2008 | Hata | .................... A61K 40/405 |
| | | | | 257/E33.056 |
| 2013/0285086 | A1 | 10/2013 | Hu et al. | |
| 2017/0200859 | A1 | 7/2017 | Do et al. | |
| 2018/0188861 | A1* | 7/2018 | Wu | ....................... H10D 86/60 |

FOREIGN PATENT DOCUMENTS

| | | | |
|---|---|---|---|
| KR | 10-2019-0075869 | A | 7/2019 |
| KR | 10-2019-0118992 | A | 10/2019 |
| KR | 10-2019-0143840 | A | 12/2019 |
| KR | 10-2020-0021866 | A | 3/2020 |
| KR | 10-2020-0026702 | A | 3/2020 |
| KR | 10-2020-0026775 | A | 3/2020 |

* cited by examiner

[Fig. 1]
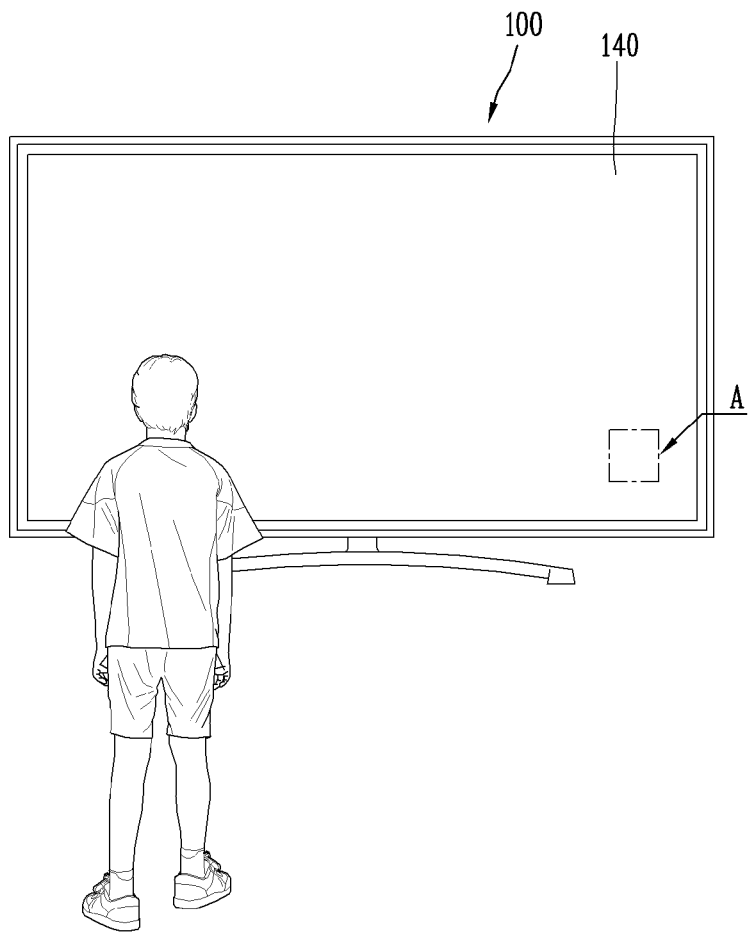
[Fig. 2]
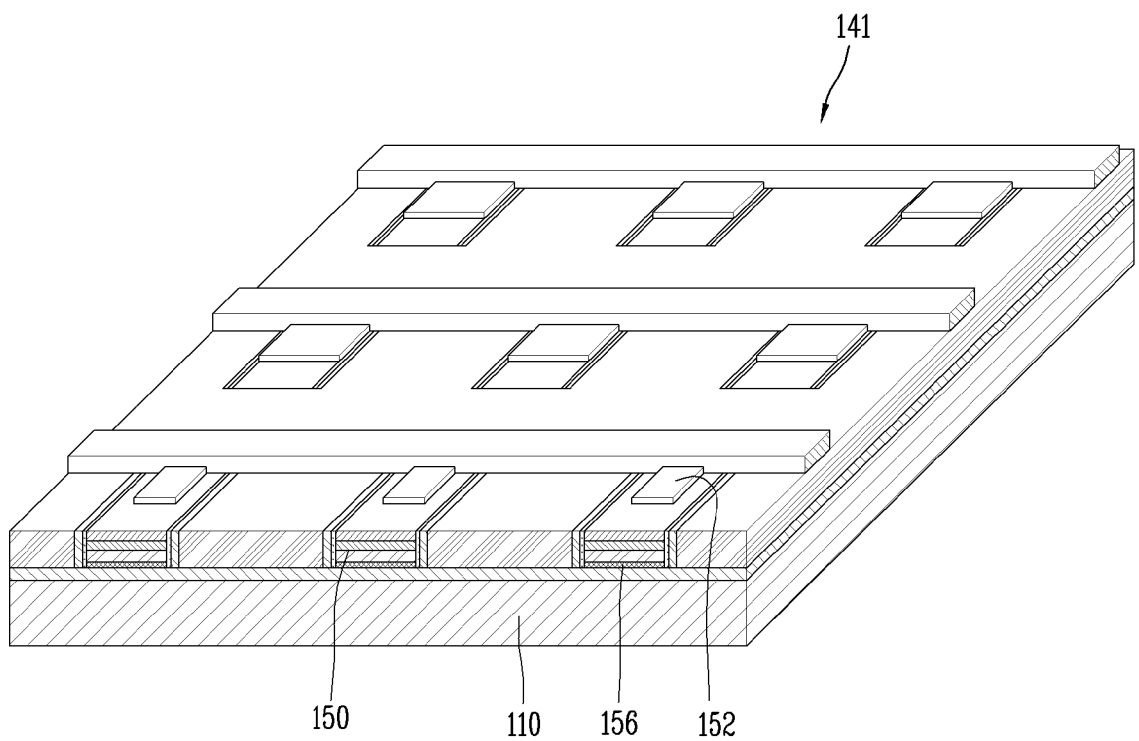

[Fig. 3]
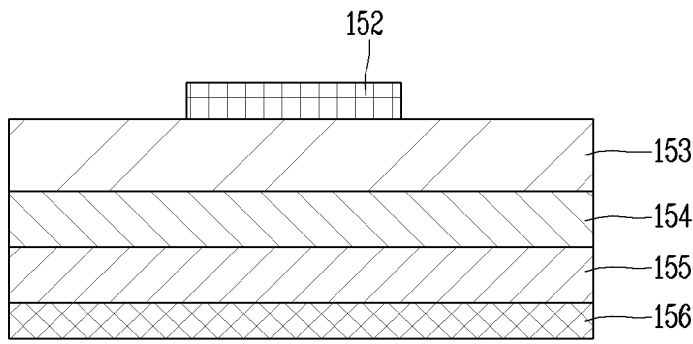
[Fig. 4]
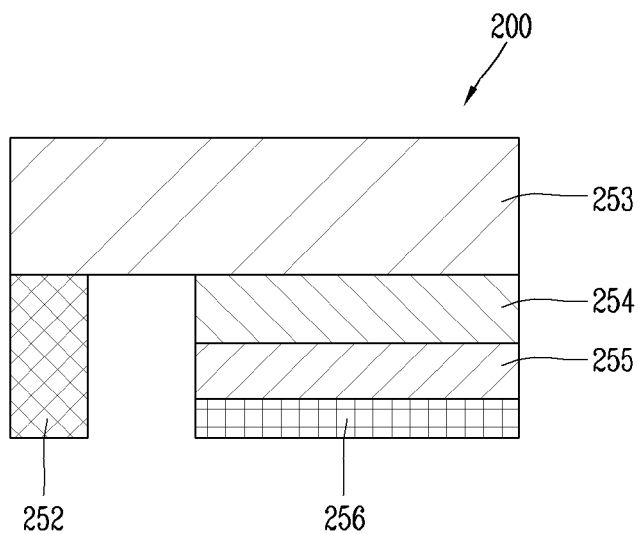
[Fig. 5a]
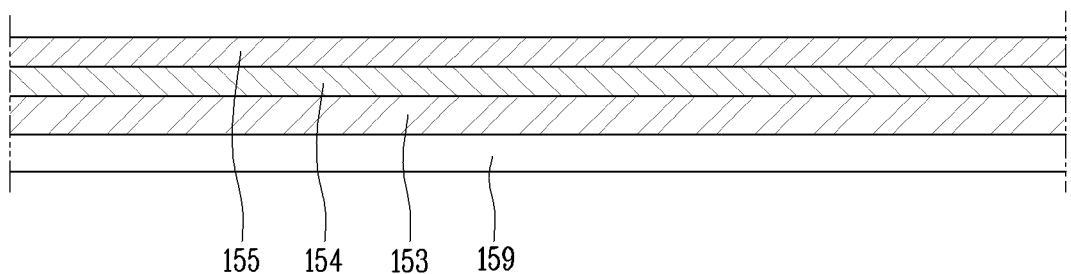
[Fig. 5b]
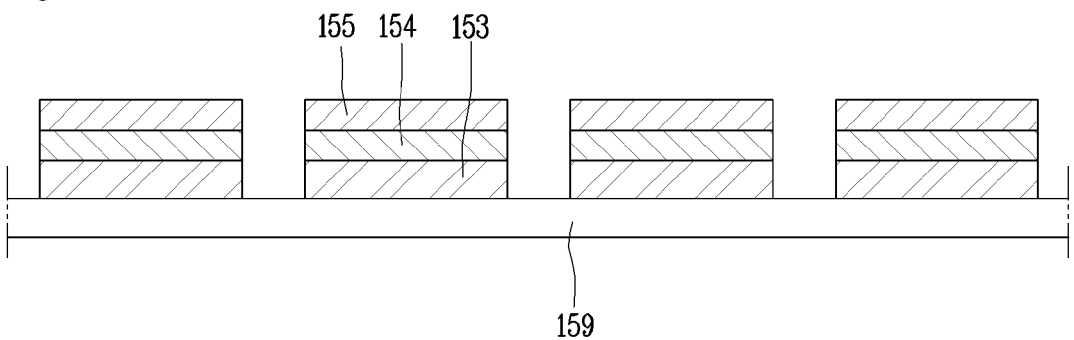

[Fig. 5c]
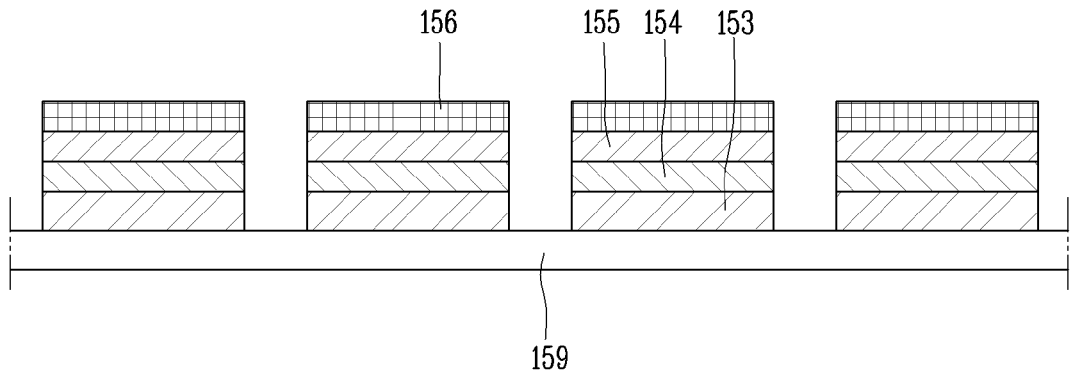
[Fig. 5d]
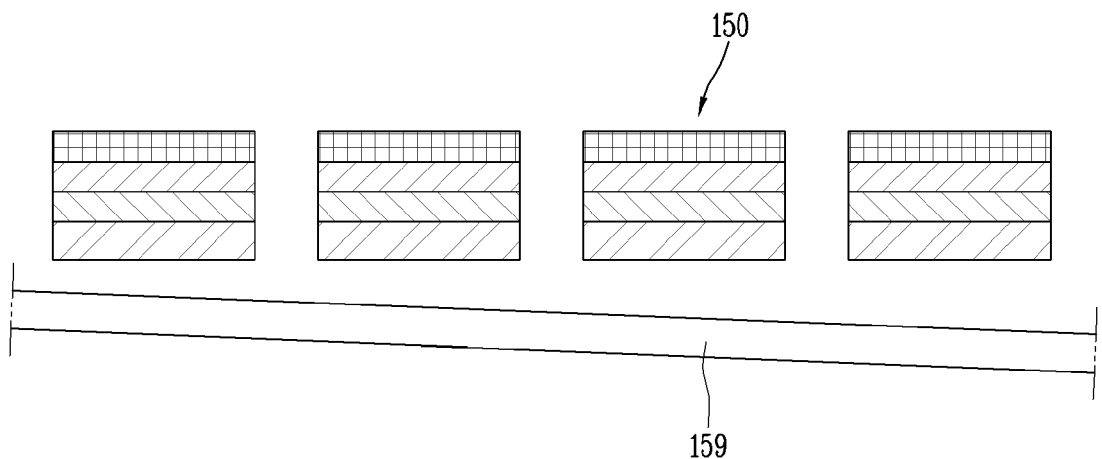
[Fig. 5e]
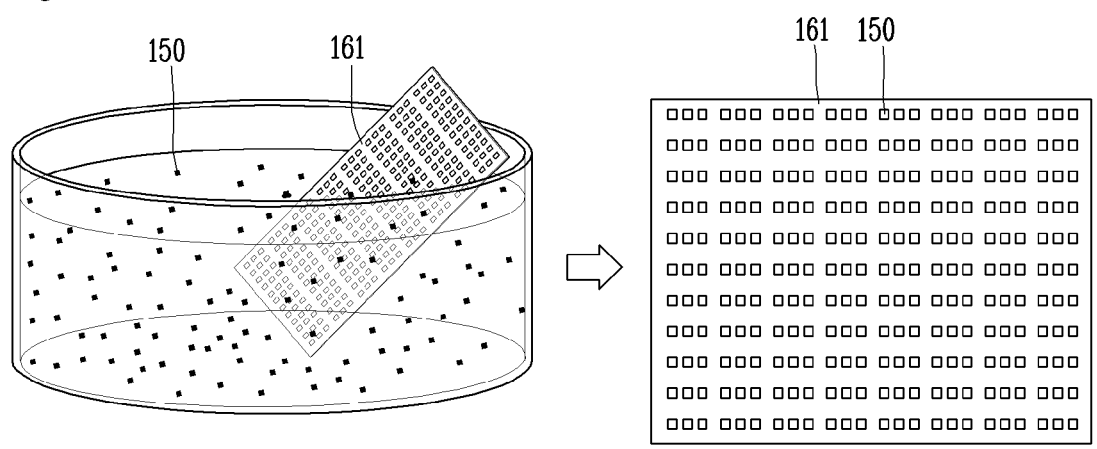

[Fig. 6]
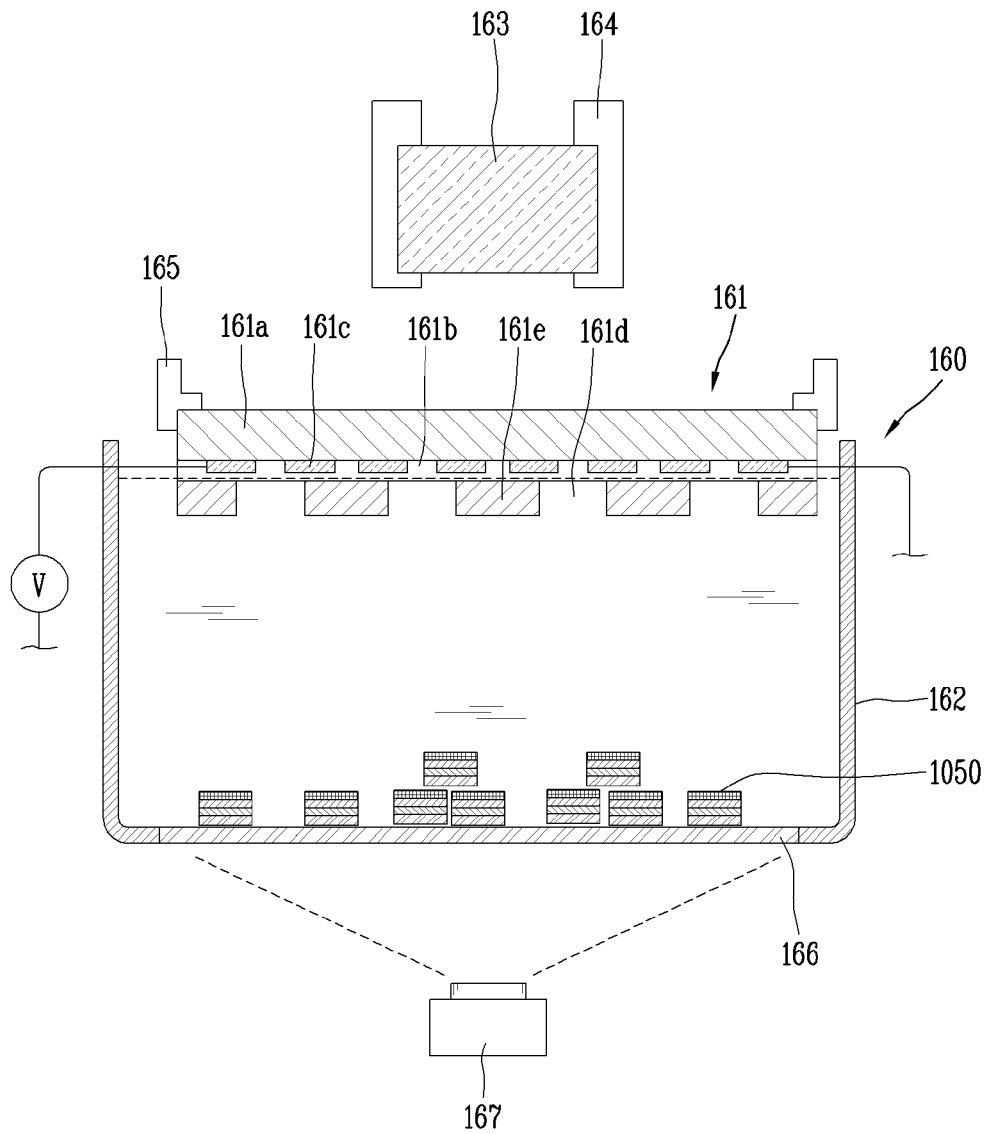
[Fig. 7]
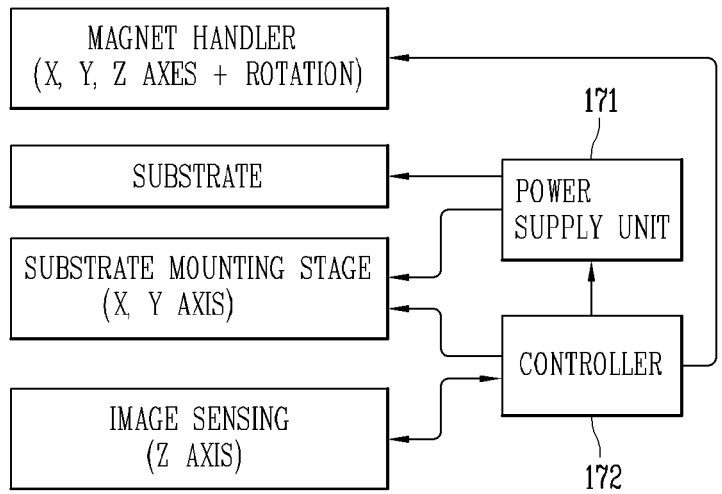

[Fig. 8a]
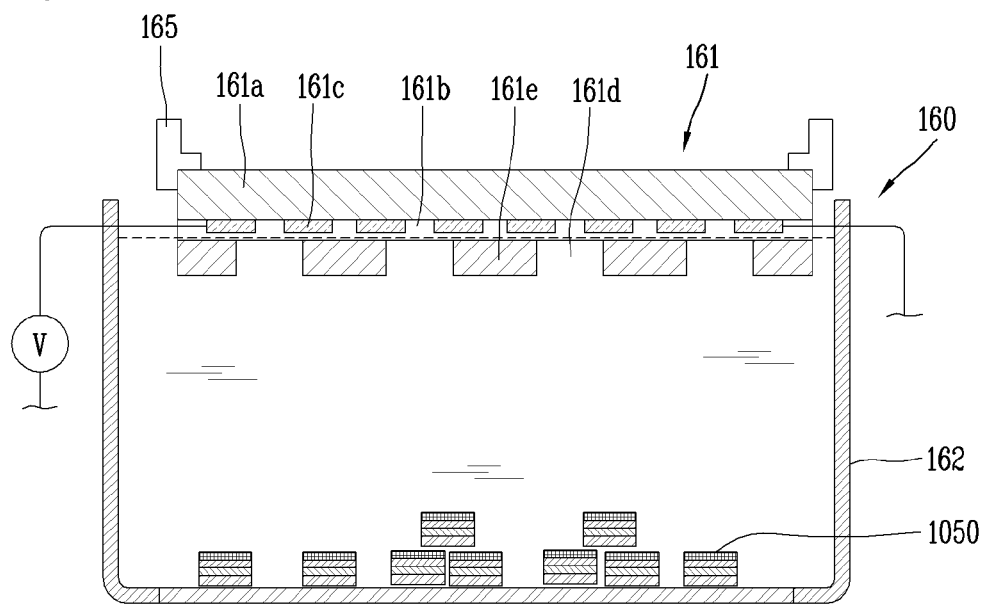
[Fig. 8b]
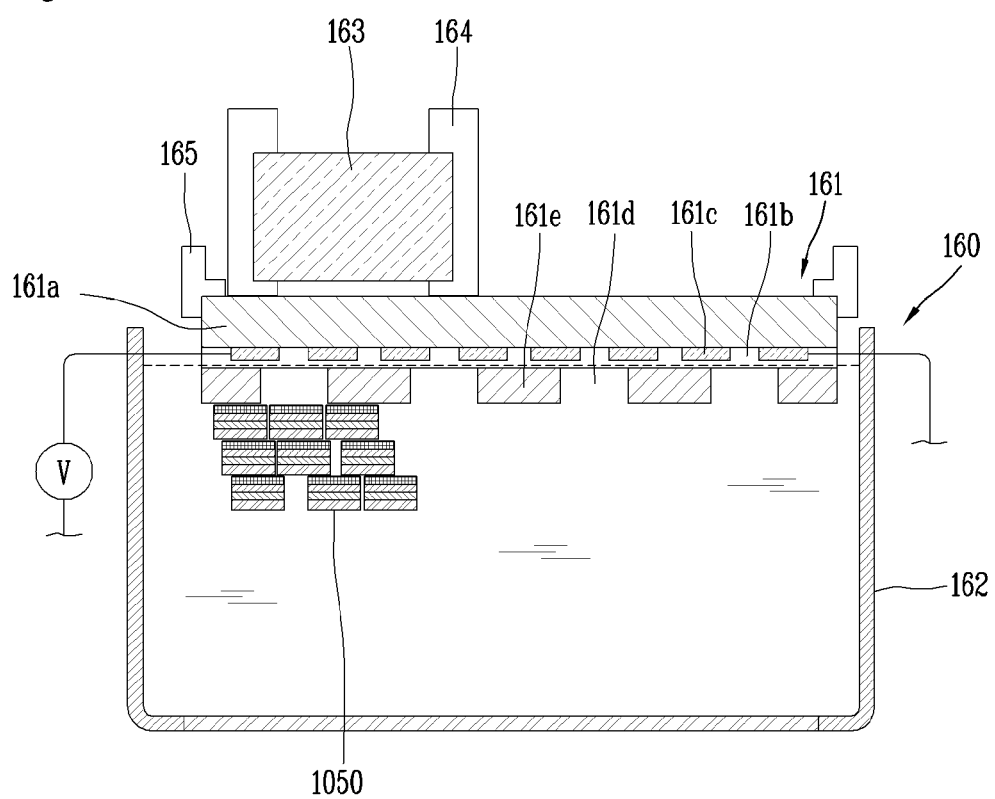

[Fig. 8c]
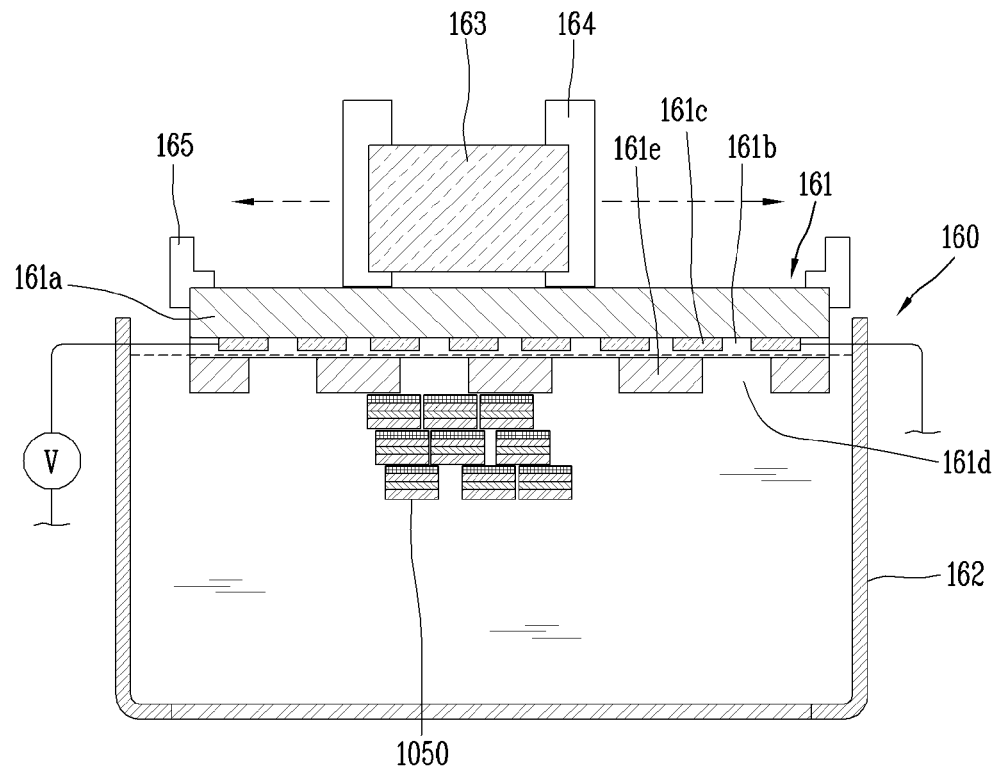
[Fig. 8d]
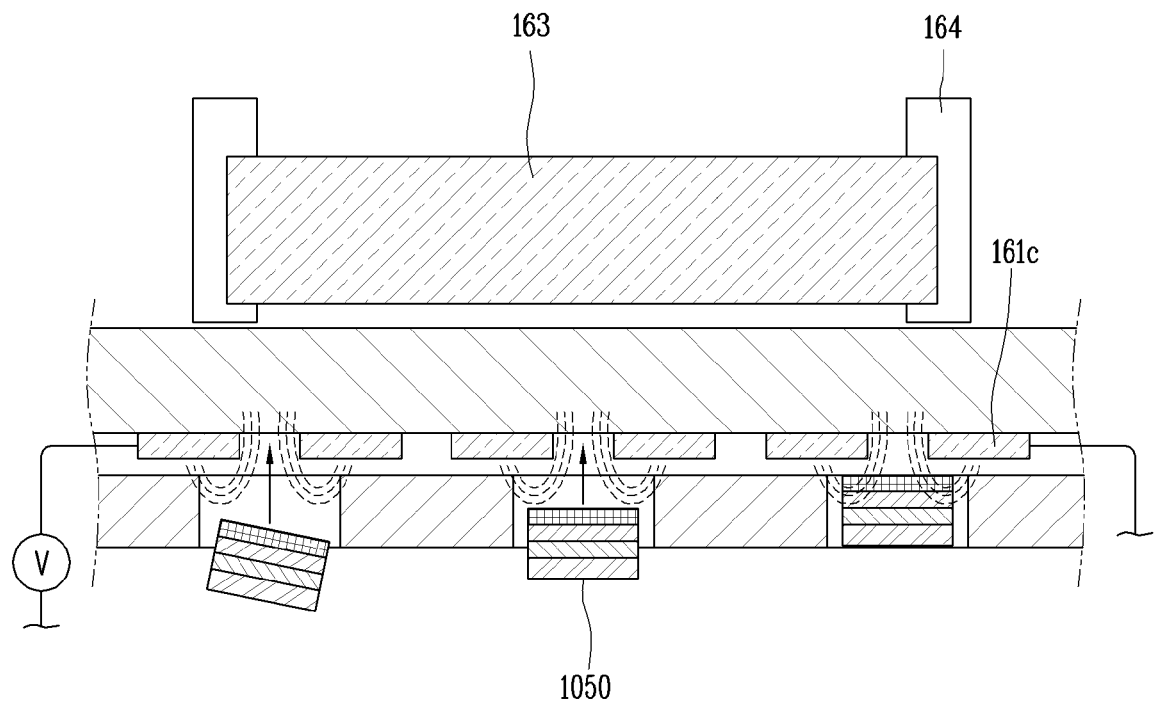

[Fig. 8e]
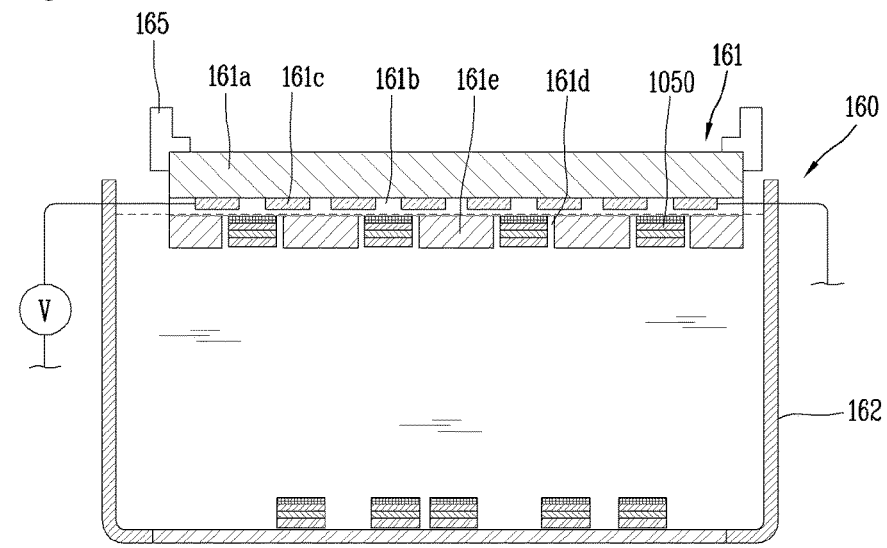
[Fig. 9]
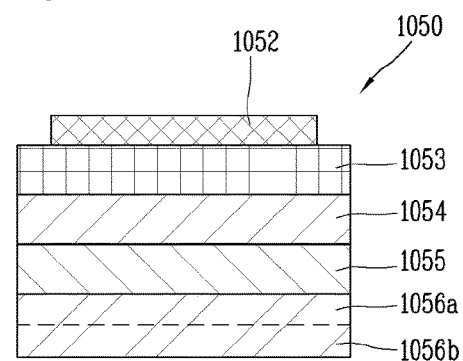
[Fig. 10a]
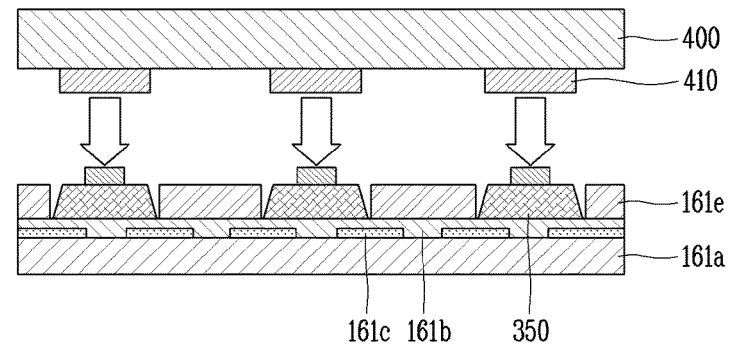
[Fig. 10b]
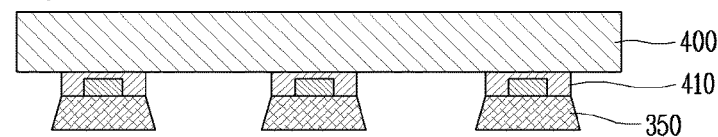
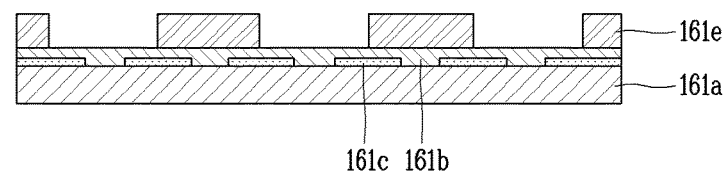

[Fig. 10c]
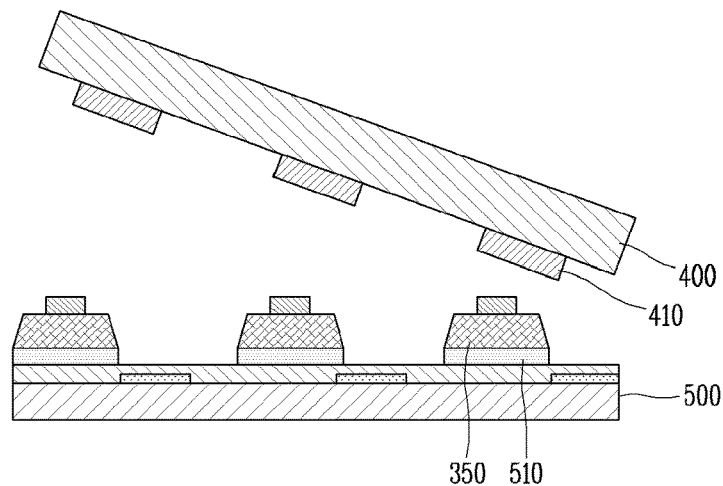
[Fig. 11]
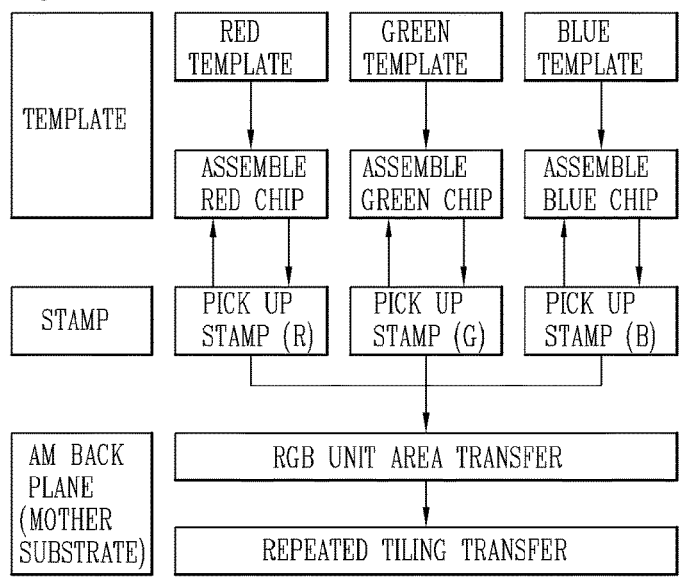
[Fig. 12]
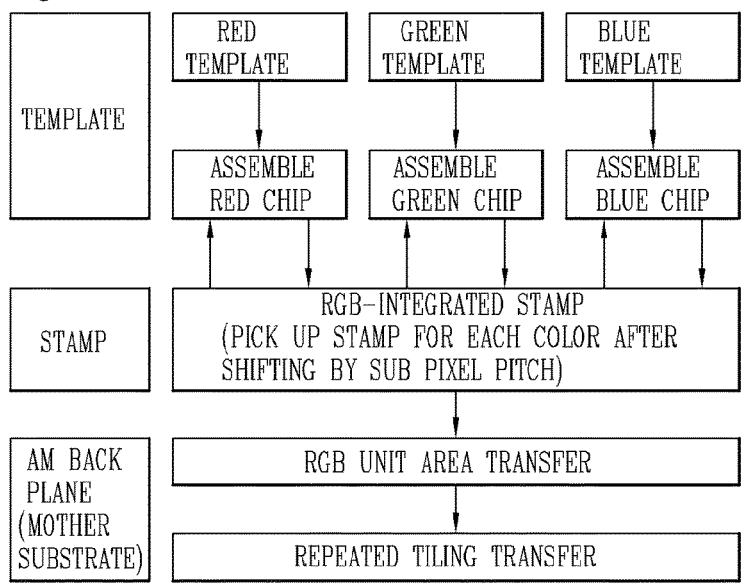

[Fig. 13]
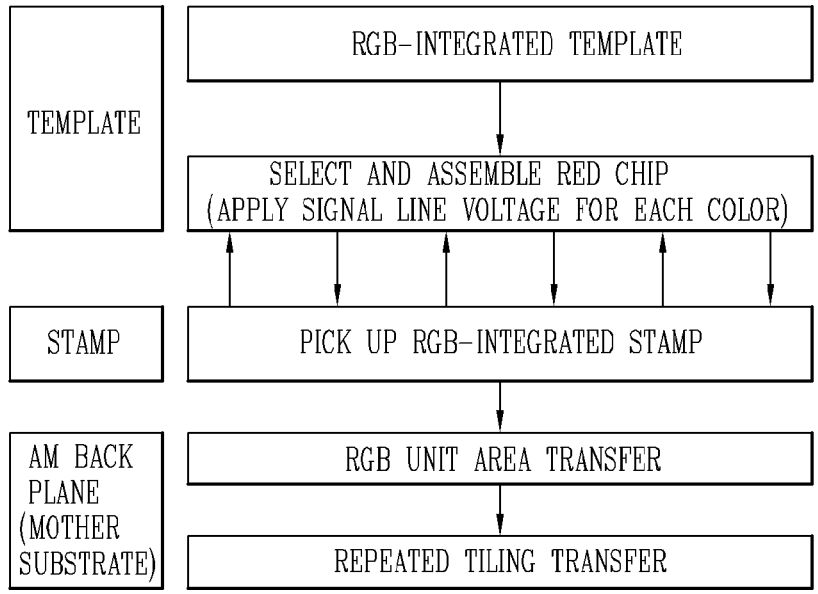
[Fig. 14]
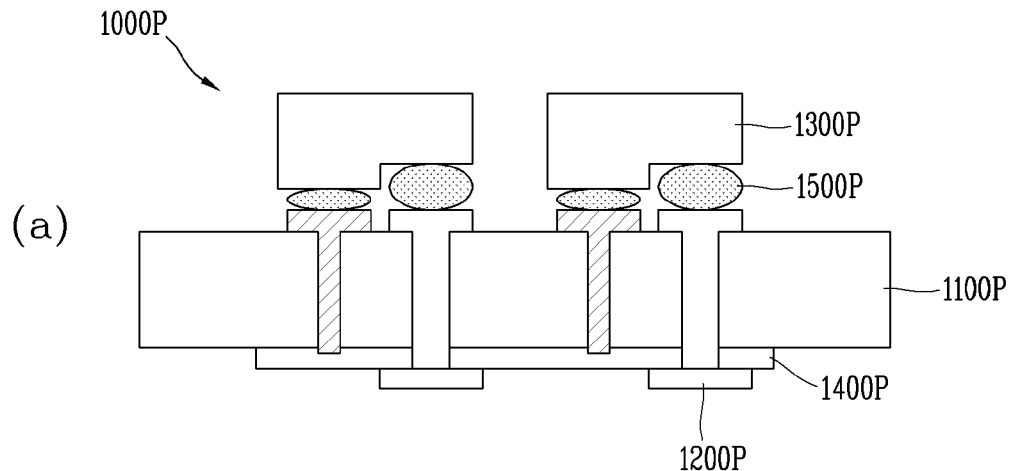
(a)
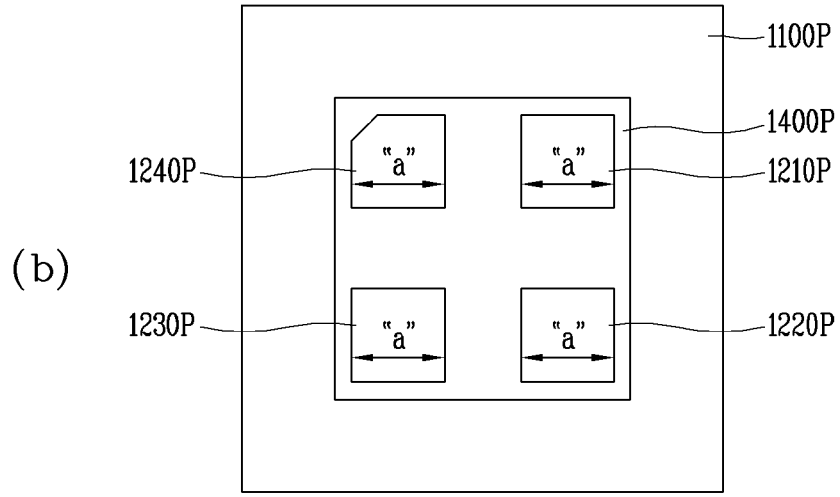
(b)

[Fig. 15]
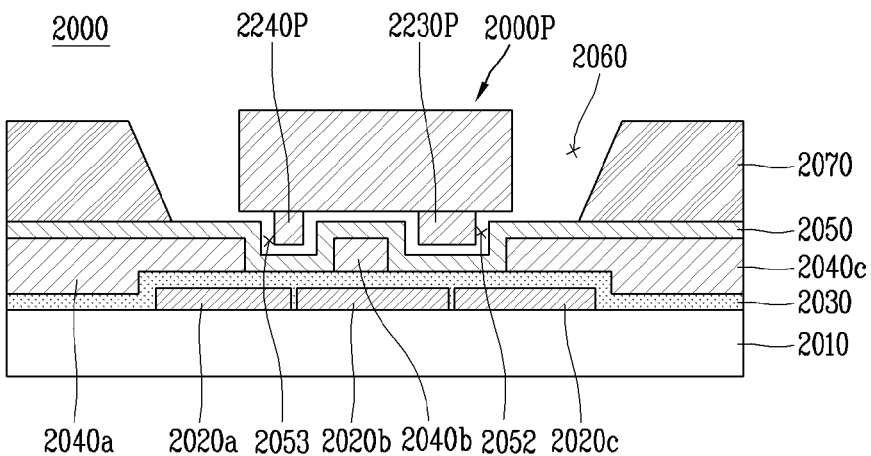
[Fig. 16]
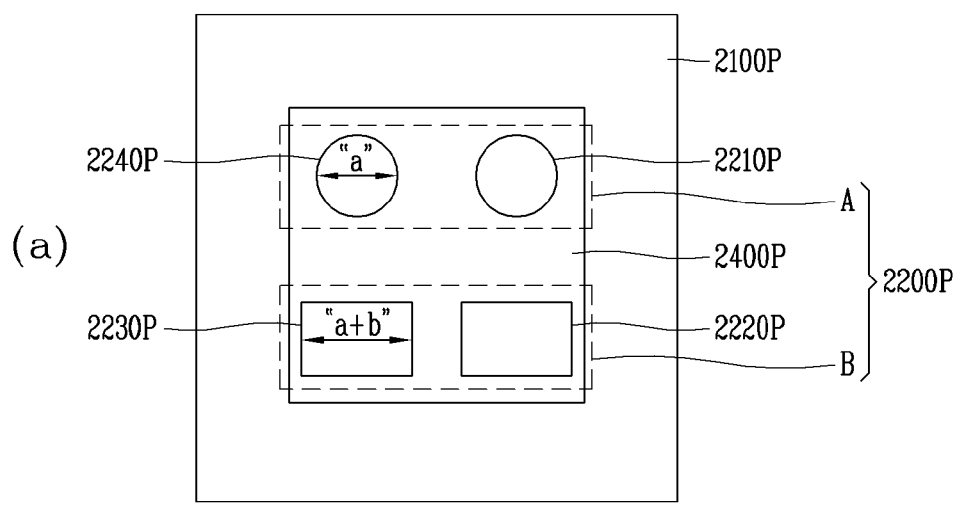
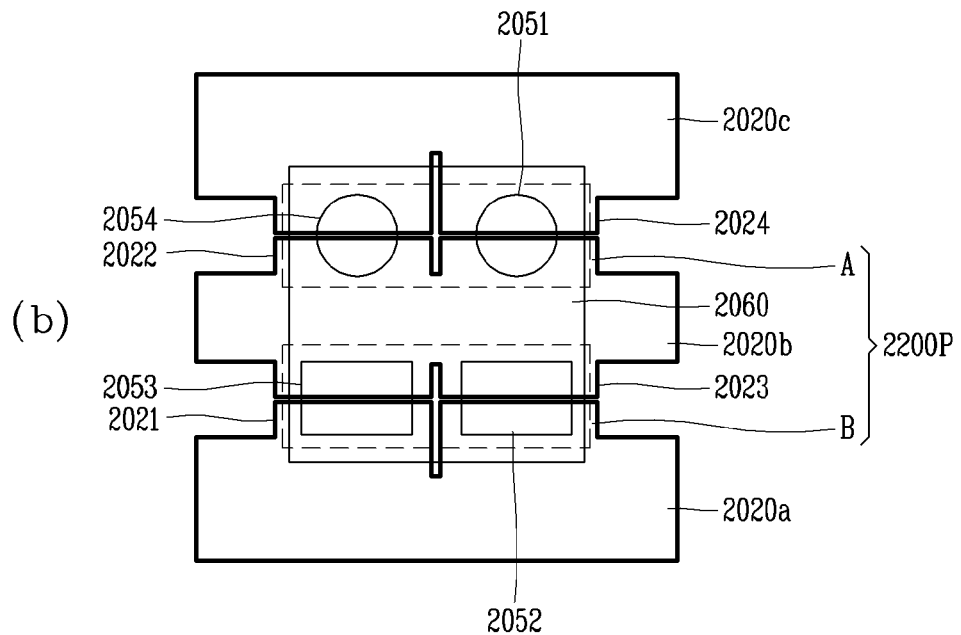

[Fig. 17]
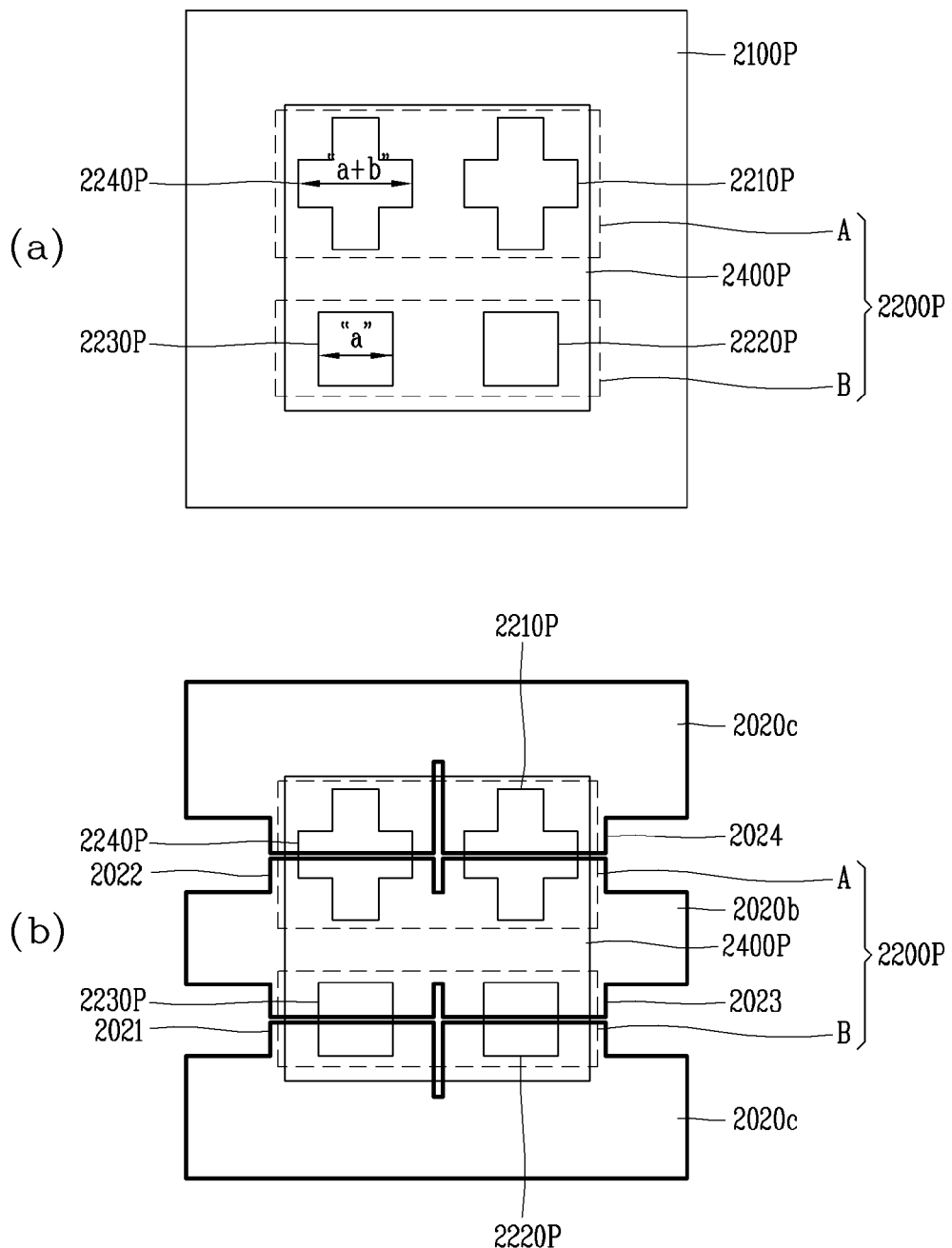

[Fig. 18]
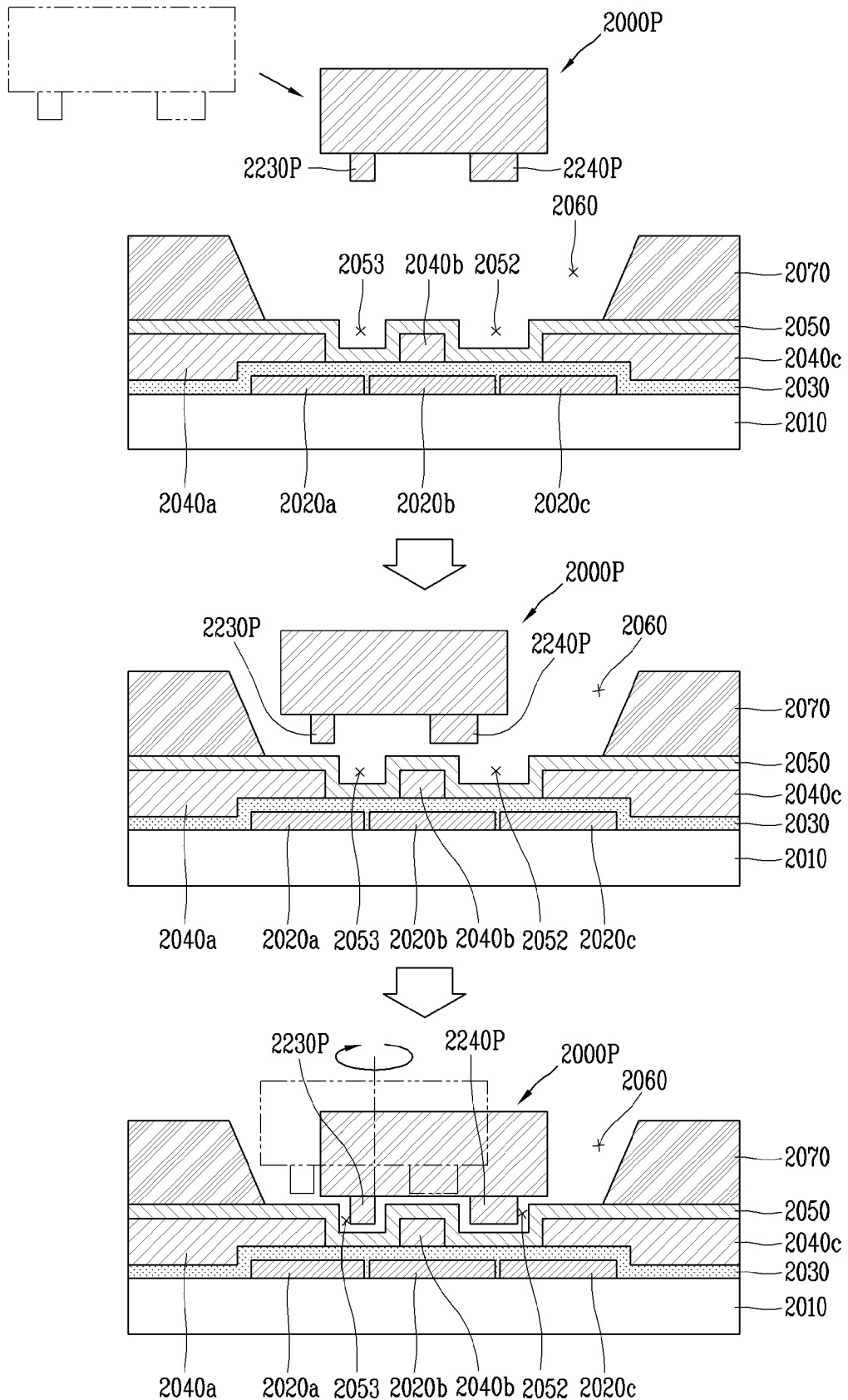

SUBSTRATE FOR MANUFACTURING DISPLAY DEVICE AND A MANUFACTURING METHOD USING THE SAME

CROSS REFERENCE TO RELATED APPLICATIONS

This application is the National Stage filing under 35 U.S.C. 371 of International Application No. PCT/KR2021/002468, filed on Feb. 26, 2021, which claims the benefit of earlier filing date of and rights of priority to Korean Patent Application No. 10-2020-0026189 filed on Mar. 2, 2020, the contents of all these applications are hereby expressly incorporated by reference into the present application.

TECHNICAL FIELD

The present disclosure relates to a substrate used to manufacture a display device using a semiconductor light-emitting device package composed of a plurality of semiconductor light-emitting devices having a size of several to several tens of µm, and a method of manufacturing the display device using the substrate.

BACKGROUND ART

In recent years, liquid crystal displays (LCDs), organic light emitting diode (OLED) displays, and micro-LED displays have been competed to implement a large-area display in the field of display technology.

Among them, a display using a semiconductor light-emitting device (micro-LED) having a diameter or cross-sectional area of 100 µm or less may provide very high efficiency because it does not absorb light using a polarizing plate or the like.

However, since millions of semiconductor light-emitting devices are required to implement a large area in the case of a micro-LED display, it has difficulty in transferring the devices compared to other technologies.

Technologies currently in development for transfer processes of micro-LEDs include pick & place, laser lift-off (LLO), self-assembly, or the like. Among them, the self-assembly method, which is a method in which the semiconductor light-emitting device locates themselves in a fluid, is the most advantageous method for realizing a large-sized display device.

Meanwhile, the self-assembly method may include a method of directly transferring semiconductor light-emitting devices to a substrate to be used as a product, and a method of transferring semiconductor light-emitting devices to a substrate for assembly and then transferring them to a substrate to be used as a product. The former undergoes a transfer process once, so it is efficient in terms of the process, and the latter has an advantage capable of adding a structure for self-assembly to a substrate for assembly with no limitation, and those two methods are selectively used.

DISCLOSURE OF INVENTION

Technical Problem

An aspect of the present disclosure is to provide a substrate used to manufacture a display device using a semiconductor light-emitting device package composed of semiconductor light-emitting devices having a size of several to tens of µm, and a method of manufacturing a display device using the substrate.

In particular, an aspect of the present disclosure is to provide a substrate having a structure in which a semiconductor light-emitting device package can be transferred by a self-assembly method, and a method of manufacturing a display device using the substrate.

Solution to Problem

A display device manufacturing substrate according to the present disclosure, which is used to manufacture a display device using a semiconductor light-emitting device package comprising a plurality of electrodes and a plurality of semiconductor light-emitting devices connected to the electrodes, may include a base portion; lower assembly electrodes extending in one direction, and disposed on the base portion; a first insulating layer formed to cover the lower assembly electrodes; upper assembly electrodes extending in the same direction as the lower assembly electrodes, and formed on the first insulating layer to overlap with the lower assembly electrodes; a second insulating layer deposited on the first insulating layer to cover the upper assembly electrodes while forming a plurality of holes in which the electrodes are accommodated; and a partition wall portion deposited on the second insulating layer while forming a cell in which the semiconductor light-emitting device package is accommodated, wherein the cell is formed to comprise the holes in the cell.

According to the present disclosure, the holes included in the cell may be formed to correspond to electrodes included in the semiconductor light-emitting device package.

According to the present disclosure, the holes included in the cell may include holes formed to be different in at least one of shape and size.

According to the present disclosure, the holes included in the cell may include two pairs of pair holes having the same shape and size, and the pair holes may be disposed along an extension direction of the lower and upper assembly electrodes.

According to the present disclosure, the holes included in the cell may include two pairs of pair holes having the same shape but having different sizes, and the pair holes may be disposed along an extension direction of the lower and upper assembly electrodes.

According to the present disclosure, when the cell includes a hole having an extension direction, an extension direction of the hole may be identical to that of the lower and upper assembly electrodes.

According to the present disclosure, the lower and upper assembly electrodes may form a group electrode between three adjacent assembly electrodes, and the cell may be formed to overlap with the group electrode of the lower and upper assembly electrodes at the same time.

According to the present disclosure, the group electrode of the lower and upper assembly electrodes may include a first and a second assembly electrode to which a first voltage signal is applied; and a third assembly electrode to which a second voltage signal is applied, wherein the third assembly electrode is disposed between the first and the second assembly electrode.

According to the present disclosure, the first and the second assembly electrode in a group electrode of the lower assembly electrodes may respectively include a first and a second protruding portion protruding toward the third assembly electrode, and the third assembly electrode may include a third protruding portion protruding toward the first assembly electrode and a fourth protruding portion protruding toward the second assembly electrode.

According to the present disclosure, the first to third assembly electrodes corresponding to a group electrode of the upper assembly electrodes may be respectively formed to overlap with the first to third assembly electrodes corresponding to a group electrode of the lower assembly electrodes.

According to the present disclosure, the holes may be respectively formed to overlap with the first assembly electrode and the third assembly electrode or the second assembly electrode and the third assembly electrode that form a group electrode of the lower assembly electrodes.

According to the present disclosure, the first to third assembly electrodes forming a group electrode of the upper assembly electrodes may be formed at a larger interval than the first to third assembly electrodes forming a group electrode of the lower assembly electrodes.

A method of manufacturing a display device according to the present disclosure may include (a) manufacturing a semiconductor light-emitting device package comprising a plurality of electrodes and a plurality of semiconductor light-emitting devices connected to the electrodes; (b) placing the semiconductor light-emitting device package into a fluid chamber, and moving a substrate comprising assembly electrodes to which the semiconductor light-emitting device package is to be transferred to a predetermined position; (c) applying a magnetic force to move the semiconductor light-emitting device package in the fluid chamber; and (d) applying a voltage to the assembly electrodes to form an electric field, and guiding and seating the semiconductor light-emitting device package in the fluid chamber to a predetermined position on the substrate, wherein the substrate comprises a cell in which the semiconductor light-emitting device package is accommodated and holes in which the electrodes are accommodated.

According to the present disclosure, in the step (a), the electrodes included in the semiconductor light-emitting device package may be manufactured to be different in at least one of shape and size, and the holes in which the electrodes are accommodated may be formed to correspond to the electrodes.

According to the present disclosure, the step (d) may include guiding the semiconductor light-emitting device package into the cell; and aligning the semiconductor light-emitting device package to allow the electrodes of the semiconductor light-emitting device package guided into the cell to be accommodated in the corresponding holes formed in the substrate.

Advantageous Effects of Invention

According to the present disclosure, a substrate for manufacturing a display device has a structure in which a semiconductor light-emitting device package composed of a plurality of electrodes and semiconductor light-emitting devices can be uniformly aligned. As a result, according to the present disclosure, a semiconductor light-emitting device package that has been transferred by a pick-and-place method in the related art may be allowed to be transferred through self-assembly, thereby having an effect of improving process efficiency (improving process speed and reducing time).

BRIEF DESCRIPTION OF DRAWINGS

FIG. 1 is a conceptual view illustrating a display device using a semiconductor light-emitting device according to an embodiment of the present disclosure.

FIG. 2 is a partially enlarged view showing a portion "A" of the display device in FIG. 1.

FIG. 3 is an enlarged view showing a semiconductor light-emitting device in FIG. 2.

FIG. 4 is an enlarged view showing another embodiment of the semiconductor light-emitting device in FIG. 2.

FIGS. 5*a* through 5*e* are conceptual views for explaining a new process of manufacturing the foregoing semiconductor light-emitting device.

FIG. 6 is a conceptual view showing an example of a self-assembly device of semiconductor light-emitting devices according to the present disclosure.

FIG. 7 is a block diagram showing the self-assembly device in FIG. 6.

FIGS. 8*a* through 8*e* are conceptual views showing a step of self-assembling semiconductor light-emitting devices using the self-assembly device in FIG. 6.

FIG. 9 is a conceptual view for explaining the semiconductor light-emitting device in FIGS. 8A through 8E.

FIGS. 10*a* through 10*c* are conceptual views showing a state in which semiconductor light-emitting devices are transferred subsequent to a self-assembly process according to the present disclosure.

FIGS. 11 through 13 are flowcharts showing a method of manufacturing a display device including semiconductor light-emitting devices emitting red (R), green (G), and blue (B) light.

FIG. 14 is a conceptual view showing a structure of a semiconductor light-emitting device package in the related art.

FIG. 15 is a cross-sectional view of a substrate for manufacturing a display device according to the present disclosure.

FIG. 16 is a view showing a substrate for manufacturing a display device and an electrode of a semiconductor light-emitting device package corresponding thereto according to an embodiment of the present disclosure.

FIG. 17 is a view showing a substrate for manufacturing a display device and an electrode of a semiconductor light-emitting device package corresponding thereto according to another embodiment of the present disclosure.

FIG. 18 is a conceptual view for explaining a method of manufacturing a display device according to the present disclosure.

MODE FOR THE INVENTION

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a mobile phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, even if a new product type to be developed later includes a display, a configuration according to an embodiment disclosed herein may be applicable thereto.

FIG. 1 is a conceptual view showing a display device using a semiconductor light-emitting device according to an embodiment of the present disclosure, and FIG. 2 is a partially enlarged view showing a portion "A" of the display device in FIG. 1, and FIG. 3 is an enlarged view showing a semiconductor light-emitting device in FIG. 2, and FIG. 4 is an enlarged view showing another embodiment of the semiconductor light-emitting device in FIG. 2.

According to the illustration, information processed in the controller of the display device 100 may be displayed on a display module 140. A case 101 in the form of a closed loop surrounding an edge of the display module 140 may form a bezel of the display device 100.

The display module 140 may include a panel 141 on which an image is displayed, and the panel 141 may include micro-sized semiconductor light-emitting devices 150 and a wiring substrate 110 on which the semiconductor light-emitting devices 150 are mounted.

Wiring lines may be formed on the wiring substrate 110, and connected to an n-type electrode 152 and a p-type electrode 156 of the semiconductor light-emitting device 150. Through this, the semiconductor light-emitting device 150 may be provided on the wiring substrate 110 as a self-emitting individual pixel.

An image displayed on the panel 141 is visual information, and implemented by independently controlling the light emission of a sub-pixel arranged in a matrix form through the wiring lines.

According to the present disclosure, a micro-LED (Light Emitting Diode) is illustrated as one type of the semiconductor light-emitting device 150 that converts current into light. The micro-LED may be a light emitting diode formed with a small size of 100 μm or less. The semiconductor light-emitting device 150 may be provided in blue, red, and green light emitting regions, respectively, to implement a sub-pixel by a combination of the light emitting regions. In other words, the sub-pixel denotes a minimum unit for implementing a single color, and at least three micro-LEDs may be provided in the sub-pixel.

More specifically, referring to FIG. 3, the semiconductor light-emitting device 150 may be a vertical structure.

For example, the semiconductor light-emitting devices 150 may be implemented with a high-power light-emitting device that emits various lights including blue in which gallium nitride (GaN) is mostly used, and indium (In) and or aluminum (Al) are added thereto.

The vertical semiconductor light-emitting device 150 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 located at the bottom may be electrically connected to a p-electrode of the wiring substrate, and the n-type electrode 152 located at the top may be electrically connected to an n-electrode at an upper side of the semiconductor light-emitting device. The electrodes may be disposed in the upward/downward direction in the vertical semiconductor light-emitting device 150, thereby providing a great advantage capable of reducing the chip size.

For another example, referring to FIG. 4, the semiconductor light-emitting device may be a flip chip type semiconductor light-emitting device.

For such an example, the semiconductor light-emitting device 250 may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 disposed to be separated from the p-type electrode 256 in the horizontal direction on the n-type semiconductor layer 253. In this case, both the p-type electrode 256 and the n-type electrode 252 may be electrically connected to the p-electrode and the n-electrode of the wiring substrate at the bottom of the semiconductor light-emitting device.

The vertical semiconductor light-emitting device 150 and the horizontal semiconductor light-emitting device 250 may be a green semiconductor light-emitting device, a blue semiconductor light-emitting device, or a red semiconductor light-emitting device, respectively. The green semiconductor light-emitting device and the blue semiconductor light-emitting device may be mostly formed of gallium nitride (GaN), and indium (In) and/or aluminum (Al) may be added thereto to implement a high-power light-emitting device that emits green or blue light. For such an example, the semiconductor light-emitting device may be a gallium nitride thin-film formed in various layers such as n-Gan, p-Gan, AlGaN, and InGa, and specifically, the p-type semiconductor layer may be p-type GaN, and the n-type semiconductor layer may be N-type GaN. However, in case of the red semiconductor light-emitting device, the p-type semiconductor layer may be p-type GaAs and the n-type semiconductor layer may be n-type GaAs.

In addition, a p-electrode side in the p-type semiconductor layer may be p-type GaN doped with Mg, and an n-electrode side in the n-type semiconductor layer may be n-type GaN doped with Si. In this case, the above-described semiconductor light-emitting devices may be semiconductor light-emitting devices without an active layer.

On the other hand, referring to FIGS. 1 through 4, since the light-emitting diode is very small, the display panel may be arranged with self-emitting sub-pixels arranged at fine pitch, thereby implementing a high-quality display device.

In a display device using the semiconductor light-emitting device of the present disclosure described above, a semiconductor light-emitting device grown on a wafer and formed through mesa and isolation is used as an individual pixel.

In this case, the micro-sized semiconductor light-emitting device 150 must be transferred to a wafer at a predetermined position on the substrate of the display panel. Pick and place is used for the transfer technology, but the success rate is low and a lot of time is required. For another example, there is a technology of transferring a plurality of devices at one time using a stamp or a roll, but the yield is limited and not suitable for a large screen display.

The present disclosure proposes a new manufacturing method of a display device capable of solving the foregoing problems and a manufacturing device using the same.

For this purpose, first, a new manufacturing method of the display device will be described. FIGS. 5A through 5E are conceptual views for explaining a new process of manufacturing the foregoing semiconductor light-emitting device.

In this specification, a display device using a passive matrix (PM) semiconductor light-emitting device is illustrated. However, an example described below may also be applicable to an active-matrix (AM) type semiconductor light-emitting device. In addition, a method of self-assembling a horizontal semiconductor light-emitting device is illustrated, but it is also applicable to a method of self-assembling a vertical semiconductor light-emitting device.

First, according to a manufacturing method, a first conductive semiconductor layer 153, an active layer 154, and a second conductive semiconductor layer 155 are respectively grown on a growth substrate 159.

When the first conductive semiconductor layer 153 is grown, next, the active layer 154 is grown on the first conductive semiconductor layer 153, and then the second conductive semiconductor layer 155 is grown on the active layer 154. As described above, when the first conductive semiconductor layer 153, the active layer 154 and the second conductive semiconductor layer 155 are sequentially grown, the first conductive semiconductor layer 153, the active layer 154, and the second conductive semiconductor layer 155 form a layer structure as illustrated in FIG. 5A.

In this case, the first conductive semiconductor layer 153 may be a p-type semiconductor layer, and the second conductive semiconductor layer 155 may be an n-type semiconductor layer. However, the present disclosure is not limited thereto, and the first conductive type may be n-type and the second conductive type may be p-type.

In addition, the present embodiment illustrates a case where the active layer is present, but it is also possible to adopt a structure in which the active layer is not present as described above. For such an example, the p-type semiconductor layer may be p-type GaN doped with Mg, and an n-electrode side in the n-type semiconductor layer may be n-type GaN doped with Si.

The growth substrate 159 (wafer) may be formed of any one of materials having light transmission properties, for example, sapphire ($Al_2O_3$), GaN, ZnO, and AlO, but is not limited thereto. Furthermore, the growth substrate 159 may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

Next, at least part of the first conductive semiconductor layer 153, the active layer 154, and the second conductive semiconductor layer 155 is removed to form a plurality of semiconductor light-emitting devices (FIG. 5B).

More specifically, isolation is performed to allow a plurality of light-emitting devices form a light-emitting device array. In other words, the first conductive semiconductor layer 153, the active layer 154, and the second conductive semiconductor layer 155 are etched in a vertical direction to form a plurality of semiconductor light-emitting devices.

If it is a case of forming the horizontal semiconductor light-emitting device, then the active layer 154 and the second conductive semiconductor layer 155 may be partially removed in a vertical direction to perform a mesa process in which the first conductive semiconductor layer 153 is exposed to the outside, and then isolation in which the first conductive semiconductor layer is etched to form a plurality of semiconductor light-emitting device arrays.

Next, a second conductive electrode 156 (or a p-type electrode) is respectively formed on one surface of the second conductive semiconductor layer 155 (FIG. 5C). The second conductive electrode 156 may be formed by a deposition process such as sputtering, but the present disclosure is not necessarily limited thereto. However, when the first conductive semiconductor layer and the second conductive semiconductor layer are an n-type semiconductor layer and a p-type semiconductor layer, respectively, the second conductive electrode 156 may also be an n-type electrode.

Then, the growth substrate 159 is removed to provide a plurality of semiconductor light-emitting devices. For example, the growth substrate 159 may be removed using a laser lift-off (LLO) or chemical lift-off (CLO) method (FIG. 5D).

Then, the process of mounting the semiconductor light-emitting devices 150 on the substrate in a chamber filled with a fluid is carried out (FIG. 5E).

For example, the semiconductor light-emitting devices 150 and the substrate are placed in a chamber filled with a fluid, and the semiconductor light-emitting devices are assembled to the substrate 161 by themselves using flow, gravity, surface tension, or the like. In this case, the substrate may be an assembly substrate 161.

For another example, the wiring substrate may also be placed in the fluid chamber instead of the assembly substrate 161 such that the semiconductor light-emitting devices 150 are directly seated on the wiring substrate. However, for convenience of description, in the present disclosure, it is illustrated that the substrate is provided as an assembly substrate 161 and the semiconductor light-emitting devices 1050 are seated thereon.

Cells (not shown) into which the semiconductor light-emitting devices 150 are fitted may be provided on the assembly substrate 161 so that the semiconductor light-emitting devices 150 are easily seated on the assembly substrate 161. Specifically, cells on which the semiconductor light-emitting devices 150 are seated are formed on the assembly substrate 161 at a position where the semiconductor light-emitting devices 150 are aligned with the wiring electrode. The semiconductor light-emitting devices 150 are assembled into the cells while moving in the fluid.

When the plurality of semiconductor light-emitting devices are arrayed on the assembly substrate 161, and then the semiconductor light-emitting devices on the assembly substrate 161 are transferred to the wiring substrate, it may enable large-area transfer. Therefore, the assembly substrate 161 may be referred to as a temporary substrate.

Meanwhile, the self-assembly method described above must increase transfer yield when applied to the manufacturing of a large-screen display. The present disclosure proposes a method and apparatus for minimizing the influence of gravity or friction and preventing non-specific binding in order to increase the transfer yield.

In this case, in a display device according to the present disclosure, a magnetic body is disposed on the semiconductor light-emitting device to move the semiconductor light-emitting device using a magnetic force, and place the semiconductor light-emitting device at preset position using an electric field in the movement process. Hereinafter, such a transfer method and device will be described in more detail with reference to the accompanying drawings.

FIG. 6 is a conceptual view showing an example of a self-assembly device of semiconductor light-emitting devices according to the present disclosure, and FIG. 7 is a block diagram showing the self-assembly device in FIG. 6.

FIGS. 8A through 8E are conceptual views showing a process of self-assembling semiconductor light-emitting devices using the self-assembly device in FIG. 6, and FIG. 9 is a conceptual view for explaining the semiconductor light-emitting device in FIGS. 8A through 8E.

According to the illustration of FIGS. 6 and 7, a self-assembly device 160 of the present disclosure may include a fluid chamber 162, a magnet 163, and a location controller 164.

The fluid chamber 162 has a space for accommodating a plurality of semiconductor light-emitting devices. The space may be filled with a fluid, and the fluid may include water or the like as an assembly solution. Accordingly, the fluid chamber 162 may be a water tank, and may be configured with an open type. However, the present disclosure is not limited thereto, and the fluid chamber 162 may be a closed type in which the space is formed with a closed space.

The substrate 161 may be disposed on the fluid chamber 162 such that an assembly surface on which the semiconductor light-emitting devices 150 are assembled faces downward. For example, the substrate 161 may be transferred to an assembly position by a transfer unit, and the transfer unit may include a stage 165 on which the substrate is mounted. The stage 165 is positioned by the controller, and the substrate 161 may be transferred to the assembly position through the stage 165.

At this time, the assembly surface of the substrate 161 faces the bottom of the fluid chamber 150 at the assembly position. According to the illustration, the assembly surface of the substrate 161 is disposed so as to be immersed in a fluid in the fluid chamber 162. Therefore, the semiconductor light-emitting devices 150 are moved to the assembly surface in the fluid.

The substrate 161, which is an assembly substrate on which an electric field can be formed, may include a base portion 161a, a dielectric layer 161b and a plurality of electrodes 161c.

The base portion 161a may be made of an insulating material, and the plurality of electrodes 161c may be a thin or a thick film bi-planar electrode patterned on one side of the base portion 161a. The electrode 161c may be formed of, for example, a laminate of Ti/Cu/Ti, an Ag paste, ITO, and the like.

The dielectric layer 161b is made of an inorganic material such as $SiO_2$, $SiN_x$, SiON, $Al_2O_3$, $TiO_2$, $HfO_2$, or the like. Alternatively, the dielectric layer 161b may be composed of a single layer or multiple layers as an organic insulator. A thickness of the dielectric layer 161b may be several tens of nanometers to several micrometers.

Furthermore, the substrate 161 according to the present disclosure includes a plurality of cells 161d partitioned by partition walls. The cells 161d may be sequentially arranged along one direction, and made of a polymer material. In addition, the partition wall 161e constituting the cells 161d is configured to be shared with neighboring cells 161d. The partition walls 161e are protruded from the base portion 161a, and the cells 161d may be sequentially arranged along the one direction by the partition walls 161e. More specifically, the cells 161d are sequentially arranged in row and column directions, and may have a matrix structure.

An inside of the cells 161d has a groove for accommodating the semiconductor light-emitting device 150, and the groove may be a space defined by the partition walls 161e. The shape of the groove may be the same as or similar to that of the semiconductor light-emitting device. For example, when the semiconductor light-emitting device is in a rectangular shape, the groove may be a rectangular shape. In addition, although not shown, when the semiconductor light-emitting device is circular, the grooves formed in the cells may be formed in a circular shape. Moreover, each of the cells is configured to accommodate a single semiconductor light-emitting device. In other words, a single semiconductor light-emitting device is accommodated in a single cell.

Meanwhile, the plurality of electrodes 161c include a plurality of electrode lines disposed at the bottom of each of the cells 161d, and the plurality of electrode lines may be configured to extend to neighboring cells.

The plurality of electrodes 161c are disposed below the cells 161d and applied with different polarities to generate an electric field in the cells 161d. In order to form the electric field, the dielectric layer may form the bottom of the cells 161d while the dielectric layer covers the plurality of electrodes 161c. In such a structure, when different polarities are applied to a pair of electrodes 161c from a lower side of each cell 161d, an electric field may be formed, and the semiconductor light-emitting device may be inserted into the cells 161d by the electric field.

At the assembly position, the electrodes of the substrate 161 are electrically connected to the power supply unit 171. The power supply unit 171 applies power to the plurality of electrodes to generate the electric field.

According to the illustration, the self-assembly device may include a magnet 163 for applying a magnetic force to the semiconductor light-emitting devices. The magnet 163 is spaced apart from the fluid chamber 162 to apply a magnetic force to the semiconductor light-emitting devices 150. The magnet 163 may be disposed to face an opposite side of the assembly surface of the substrate 161, and the location of the magnet is controlled by the location controller 164 connected to the magnet 163.

The semiconductor light-emitting device 1050 may have a magnetic body so as to move in the fluid by the magnetic field of the magnet 163.

Referring to FIG. 9, the semiconductor light-emitting device of the display device having a magnetic body may include a first conductive electrode 1052 and a second conductive electrode 1056, a first conductive semiconductor layer 1053 disposed with the first conductive electrode 1052, a second conductive semiconductor layer 1055 configured to overlap with the first conductive semiconductor layer 1052, and disposed with the second conductive electrode 1056, and an active layer 1054 disposed between the first and second conductive semiconductor layers 1053, 1055.

Here, the first conductive type and the second conductive type may be composed of p-type and n-type, and vice versa. In addition, as described above, it may be a semiconductor light-emitting device without having the active layer.

Meanwhile, in the present disclosure, the first conductive electrode 1052 may be generated after the semiconductor light-emitting device is assembled to the wiring substrate by the self-assembly of the semiconductor light-emitting device. In addition, in the present disclosure, the second conductive electrode 1056 may include the magnetic body. The magnetic body may refer to a metal having magnetism. The magnetic body may be Ni, SmCo or the like, and for another example, a material corresponding to at least one of Gd-based, La-based, and Mn-based materials.

The magnetic body may be provided in the second conductive electrode 1056 in the form of particles. Furthermore, alternatively, for a conductive electrode including a magnetic body, a single layer of the conductive electrode may be made of a magnetic body. For such an example, as illustrated in FIG. 9, the second conductive electrode 1056 of the semiconductor light-emitting device 1050 may include a first layer 1056a and a second layer 1056b. Here, the first layer 1056a may be made to include a magnetic material, and the second layer 1056b may include a metal material other than the magnetic material.

In this example, the first layer 1056a including a magnetic body may be disposed to be in contact with the second conductive semiconductor layer 1055. In this case, the first layer 1056a is disposed between the second layer 1056b and the second conductive semiconductor layer 1055. The second layer 1056b may be a contact metal connected to the second electrode of the wiring substrate. However, the present disclosure is not necessarily limited thereto, and the magnetic body may be disposed on one surface of the first conductive semiconductor layer.

Referring again to FIGS. 6 and 7, more specifically, the self-assembly device may include a magnet handler that can be automatically or manually moved in the x, y, and z axes on the top of the fluid chamber or include a motor capable of rotating the magnet 163. The magnet handler and the motor may constitute the location controller 164. Through this, the magnet 163 rotates in a horizontal direction, a clockwise direction, or a counterclockwise direction with respect to the substrate 161.

On the other hand, a light transmitting bottom plate 166 may be formed in the fluid chamber 162, and the semiconductor light-emitting devices may be disposed between the bottom plate 166 and the substrate 161. An image sensor 167 may be positioned to view the bottom plate 166 so as to monitor an inside of the fluid chamber 162 through the bottom plate 166. The image sensor 167 is controlled by the controller 172, and may include an inverted type lens, a CCD, and the like to observe the assembly surface of the substrate 161.

The self-assembling apparatus described above is configured to use a combination of a magnetic field and an electric field, and using those fields, the semiconductor light-emitting devices may be placed at preset positions of the substrate by an electric field in the process of being moved by a location change of the magnet. Hereinafter, an assembly process using the self-assembly device described above will be described in more detail.

First, a plurality of semiconductor light-emitting devices 1050 having magnetic bodies are formed through the process described with reference to FIGS. 5A through 5C. In this case, a magnetic body may be deposited on the semiconductor light-emitting device in the process of forming the second conductive electrode in FIG. 5C.

Next, the substrate 161 is transferred to the assembly position, and the semiconductor light-emitting devices 1050 are placed into the fluid chamber 162 (FIG. 8A).

As described above, the assembly position of the substrate 161 is a position at which the assembly surface on which the semiconductor light-emitting devices 1050 of the substrate 161 are assembled is disposed in a downward direction in the fluid chamber 162.

In this case, some of the semiconductor light-emitting devices 1050 may sink to the bottom of the fluid chamber 162 and some may float in the fluid. The light transmitting bottom plate 166 may be provided in the fluid chamber 162, and some of the semiconductor light-emitting devices 1050 may sink to the bottom plate 166.

Next, a magnetic force is applied to the semiconductor light-emitting devices 1050 so that the semiconductor light-emitting devices 1050 float in the fluid chamber 162 in a vertical direction (FIG. 8B).

When the magnet 163 of the self-assembly device moves from its original position to an opposite side of the assembly surface of the substrate 161, the semiconductor light-emitting devices 1050 float in the fluid toward the substrate 161. The original position may be a position away from the fluid chamber 162. For another example, the magnet 163 may be composed of an electromagnet. In this case, electricity is supplied to the electromagnet to generate an initial magnetic force.

Meanwhile, in this example, a separation distance between the assembly surface of the substrate 161 and the semiconductor light-emitting devices 1050 may be controlled by adjusting the magnitude of the magnetic force. For example, the separation distance is controlled using the weight, buoyancy, and magnetic force of the semiconductor light-emitting devices 1050. The separation distance may be several millimeters to tens of micrometers from the outermost edge of the substrate.

Next, a magnetic force is applied to the semiconductor light-emitting devices 1050 so that the semiconductor light-emitting devices 1050 move in one direction in the fluid chamber 162. For example, the magnet 163 moves in a horizontal direction, a clockwise direction or a counterclockwise direction with respect to the substrate (FIG. 8C). In this case, the semiconductor light-emitting devices 1050 move in a direction parallel to the substrate 161 at a position spaced apart from the substrate 161 by the magnetic force.

Next, the process of applying an electric field to guide the semiconductor light-emitting devices 1050 to preset positions of the substrate 161 so as to allow the semiconductor light-emitting devices 1050 to be placed at the preset positions during the movement of the semiconductor light-emitting devices 250 is carried out (FIG. 8C).

For example, the semiconductor light-emitting devices 1050 move in a direction perpendicular to the substrate 161 by the electric field to be placed at preset positions of the substrate 161 while moving along a direction parallel to the substrate 161.

More specifically, electric power is supplied to a bi-planar electrode of the substrate 161 to generate an electric field to carry out assembly only at preset positions. In other words, the semiconductor light-emitting devices 1050 are assembled to the assembly position of the substrate 161 using a selectively generated electric field. For this purpose, the substrate 161 may include cells in which the semiconductor light-emitting devices 1050 are inserted.

Then, the unloading process of the substrate 161 is carried out, and the assembly process is completed. When the substrate 161 is an assembly substrate, a post-process of transferring the aligned semiconductor light-emitting devices to a wiring substrate as described above to implement a display device may be carried out.

On the other hand, the semiconductor light-emitting devices 1050 may be guided to the preset positions, then the magnet 163 may move in a direction away from the substrate 161 such that the semiconductor light-emitting devices 1050 remaining in the fluid chambers 162 fall to the bottom of the fluid chambers 162, (FIG. 8D). For another example, if power supply is stopped when the magnet 163 is an electromagnet, then the semiconductor light-emitting devices 1050 remaining in the fluid chamber 162 fall to the bottom of the fluid chamber 162.

Then, when the semiconductor light-emitting devices 1050 on the bottom of the fluid chamber 162 are collected, the collected semiconductor light-emitting devices 1050 may be reused.

The above-described self-assembly device and method are characterized in that, in order to increase the assembly yield in a fluidic assembly, parts at a far distance are concentrated adjacent to a preset assembly site using a magnetic field, and a separate electric field is applied to the assembly site to selectively assemble the parts only in the assembly site. At this time, the assembly substrate is placed on an upper portion of the water tank and the assembly surface faces downward, thereby preventing nonspecific coupling while minimizing the effect of gravity due to the weight of parts. In other words, in order to increase the transfer yield, the assembly substrate is placed on the top to minimize the effect of a gravitational or frictional force, and prevent nonspecific coupling.

As described above, according to the present disclosure having the foregoing configuration, a large number of semiconductor light-emitting devices may be assembled at one time in a display device in which individual pixels are formed with semiconductor light-emitting devices.

As described above, according to the present disclosure, it may be possible to pixelate semiconductor light-emitting devices in a large amount on a small-sized wafer and then transfer them to a large-area substrate. Through this, it may be possible to manufacture a large-area display device at low cost.

Meanwhile, the present disclosure provides a structure and method of an assembly substrate for increasing a yield of the foregoing self-assembly process and a process subsequent to self-assembly. The present disclosure is limited to when the substrate 161 is used as an assembly substrate. In other words, the assembly substrate to be described later is not used as a wiring substrate of a display device. Thus, hereinafter, the substrate 161 is referred to as an assembly substrate 161.

The present disclosure improves process yield from two perspectives. First, in the present disclosure, a strong electric field is formed to prevent a semiconductor light-emitting device from being seated in an undesired position due to a strong electric field formed in an undesired position. Second, the present disclosure prevents a semiconductor light-emitting device from remaining on the assembly substrate when transferring the semiconductor light-emitting devices seated on the assembly substrate to another substrate.

The foregoing solutions are not individually achieved by different components. The foregoing two solutions may be achieved by organically combining components to be described later with the assembly substrate 161 described above.

Prior to describing the present disclosure in detail, a post process for manufacturing a display device subsequent to self-assembly will be described.

FIGS. 10A through 10C are conceptual views showing a state in which semiconductor light-emitting devices are transferred subsequent to a self-assembly process according to the present disclosure.

When the self-assembly process described with reference to FIGS. 8A through 8E is finished, the semiconductor light-emitting devices are seated at preset positions of the assembly substrate 161. The semiconductor light-emitting devices seated on the assembly substrate 161 are transferred to another substrate at least once. In the present specification, an embodiment in which the semiconductor light-emitting devices seated on the assembly substrate 161 are transferred twice, but the present disclosure is not limited thereto, and the semiconductor light-emitting devices seated on the assembly substrate 161 may be transferred to another substrate once or more than three times.

On the other hand, immediately after the self-assembly process is finished, an assembly surface of the assembly substrate 161 is in a state in which the assembly surface faces downward (or a gravity direction). For a process subsequent to self-assembly, the assembly substrate 161 may be turned over 180 degrees while the semiconductor light-emitting device is seated. In this process, since there is a risk that the semiconductor light-emitting device may be released from the assembly substrate 161, a voltage must be applied to the plurality of electrodes 161c (hereinafter, assembly electrodes) while the assembly substrate 161 is turned over. An electric field formed between the assembly electrodes 161c prevents the semiconductor light-emitting device from being released from the assembly substrate 161 while the assembly substrate 161 is turned over.

Subsequent to the self-assembly process, when the assembly substrate 161 is turned over 180 degrees, it becomes a shape as shown in FIG. 10A. Specifically, as shown in FIG. 10A, the assembly surface of the assembly substrate 161 is in a state that faces upward (or a direction opposite to gravity). In this state, a transfer substrate 400 is aligned on an upper side of the assembly substrate 161.

The transfer substrate 400 is a substrate for transferring the semiconductor light-emitting devices seated on the assembly substrate 161 to a wiring substrate by releasing them. The transfer substrate 400 may be formed of a PDMS (polydimethylsiloxane) material. Therefore, the transfer substrate 400 may be referred to as a PDMS substrate.

The transfer substrate 400 is aligned with the assembly substrate 161 and then pressed onto the assembly substrate 161. Then, when the transfer substrate 400 is transferred to an upper side of the assembly substrate 161, the semiconductor light-emitting devices 350 disposed on the assembly substrate 161 due to an adhesive force of the transfer substrate 400 are moved to the transfer substrate 400.

To this end, surface energy between the semiconductor light-emitting device 350 and the transfer substrate 400 must be higher than that between the semiconductor light-emitting device 350 and the dielectric layer 161b. The probability of releasing the semiconductor light-emitting device 350 from the assembly substrate 161 increases as a difference between surface energy between the semiconductor light-emitting device 350 and the transfer substrate 400 and surface energy between the semiconductor light-emitting device 350 and the dielectric layer 161b increases, and thus a larger difference between the two surface energies is preferable.

Meanwhile, the transfer substrate 400 may include a plurality of protruding portions 410 to allow a pressure applied by the transfer substrate 400 to be concentrated on the semiconductor light-emitting device 350 when the transfer substrate 400 is pressed against the assembly substrate 161. The protruding portions 410 may be formed at the same interval as the semiconductor light-emitting devices 350 seated on the assembly substrate 161. When the protruding portions 410 are aligned to overlap with the semiconductor light-emitting devices 350 and then the transfer substrate 400 is pressed against the assembly substrate 161, a pressure by the transfer substrate 400 may be concentrated on the semiconductor light-emitting devices 350. Through this, the present disclosure increases the probability that the semiconductor light-emitting device 350 is released from the assembly substrate 161.

Meanwhile, while the semiconductor light-emitting devices 350 are seated on the assembly substrate 161, part of the semiconductor light-emitting devices 350 may be preferably exposed to an outside of the groove. When the semiconductor light-emitting devices 350 are not exposed to an outside of the groove, a pressure by the transfer substrate 400 is not concentrated on the semiconductor light-emitting devices 350, thereby reducing the probability of releasing the semiconductor light-emitting devices 350 from the assembly substrate 161

Finally, referring to FIG. 10C, a step of pressing the transfer substrate 400 to a wiring substrate 500 to transfer the semiconductor light-emitting devices 350 from the transfer substrate 400 to the wiring substrate 500 is carried out. At this time, a protruding portion 510 may be formed on the wiring substrate 500. The transfer substrate 400 and the wiring substrate 500 are aligned such that the semiconductor light-emitting devices 350 disposed on the transfer substrate 400 and the protruding portion 510 of the wiring substrate 500 overlap with each other. Then, when the transfer substrate 400 and the wiring substrate 500 are pressed, the probability of releasing the semiconductor light-emitting devices 350 from the transfer substrate 400 due to the protruding portion 510 may increase.

Meanwhile, in order for the semiconductor light-emitting devices 350 disposed on the transfer substrate 400 to be transferred to the wiring substrate 500, surface energy between the semiconductor light-emitting device 350 and the wiring substrate 500 must be higher than that between semiconductor light-emitting devices 350 and the transfer substrate 400. The probability of releasing the semiconductor light-emitting device 350 from the transfer substrate 400 increases as a difference between surface energy between the semiconductor light-emitting device 350 and the wiring substrate 500 and surface energy between the semiconductor light-emitting device 350 and the transfer substrate 400 increases, and thus a larger difference between the two surface energies is preferable.

Subsequent to transferring all of the semiconductor light-emitting devices 350 disposed on the transfer substrate 400 to the wiring substrate 500, a step of forming an electrical connection between the semiconductor light-emitting devices 350 and the wiring electrodes formed on the wiring substrate 500 may be carried out. A structure of the wiring electrode and a method of forming an electrical connection may vary depending on the type of the semiconductor light-emitting devices 350.

Meanwhile, although not shown, an anisotropic conductive film may be disposed on the wiring substrate 500. In this case, an electrical connection may be formed between the semiconductor light-emitting devices 350 and the wiring electrodes formed on the wiring substrate 500 only by pressing the transfer substrate 400 and the wiring substrate 500.

Meanwhile, when manufacturing a display device including semiconductor light-emitting devices emitting different colors, the methods described with reference to FIGS. 10A to 10C may be implemented in various ways. Hereinafter, a method of manufacturing a display device including semiconductor light-emitting devices emitting red (R), green (G), and blue (B) will be described.

FIGS. 11 through 13 are flowcharts showing a method of manufacturing a display device including semiconductor light-emitting devices emitting red (R), green (G), and blue (B) light.

Semiconductor light-emitting devices emitting different colors may be individually assembled on different assembly substrates. Specifically, the assembly substrate 161 may include a first assembly substrate on which semiconductor light-emitting devices emitting a first color are seated, a second assembly substrate on which semiconductor light-emitting devices emitting a second color different from the first color are seated, and a third assembly substrate on which semiconductor light-emitting devices emitting a third color different from the first color and the second color are seated. Different types of semiconductor light-emitting devices are assembled on each assembly substrate according to the method described with reference to FIGS. 8A to 8E. For example, semiconductor light-emitting devices emitting red (R), green (G), and blue (B) light, respectively, may be respectively assembled on first to third assembly substrates.

Referring to FIG. 11, each of a red chip, a green chip, and a blue chip may be assembled on each of first to third assembly substrates (a red template, a green template, and a blue template). In this state, each of the red, green, and blue chips may be transferred to a wiring substrate by a different transfer substrate.

Specifically, a step of transferring semiconductor light-emitting devices seated on an assembly substrate to a wiring substrate may include pressing a first transfer substrate (stamp (R)) onto the first assembly substrate (red template) to transfer semiconductor light-emitting devices (red chips) emitting a first color from the first assembly substrate to the first transfer substrate, pressing a second transfer substrate (stamp (G)) onto the second assembly substrate (green template) to transfer semiconductor light-emitting devices (green chips) emitting a second color from the second assembly substrate to the second transfer substrate, and pressing a third transfer substrate (stamp (B)) onto the third assembly substrate (blue template) to transfer semiconductor light-emitting devices (blue chips) emitting a third color from the third assembly substrate to the third transfer substrate.

Thereafter, a step of pressing the first to third transfer substrates to the wiring substrate, respectively, and transferring the semiconductor light-emitting devices emitting first to third colors from the first to third transfer substrates to the wiring substrate is carried out.

According to the manufacturing method of FIG. 11, in order to manufacture a display device including a red chip, a green chip, and a blue chip, three types of assembly substrates and three types of transfer substrates may be required.

On the contrary, referring to FIG. 12, a red chip, a green chip, and a blue chip may be respectively assembled on the first to third assembly substrates, respectively, and in this state, each of the red chip, green chip, and blue chip may be transferred to the wiring substrate by the same transfer substrate.

Specifically, a step of transferring semiconductor light-emitting devices seated on the assembly substrate to a wiring substrate may include pressing a transfer substrate (RGB integrated stamp) onto the first assembly substrate (red template) to transfer semiconductor light-emitting devices (red chips) emitting a first color from the first assembly substrate to the transfer substrate, pressing a transfer substrate onto the second assembly substrate (green template) to transfer semiconductor light-emitting devices (green chips) emitting a second color from the second assembly substrate to the transfer substrate, and pressing a transfer substrate onto the third assembly substrate (blue template) to transfer semiconductor light-emitting devices (blue chips) emitting a third color from the third assembly substrate to the transfer substrate.

In this case, alignment positions between each of the first to third assembly substrates and the transfer substrate may be different from each other. For example, when alignment between the assembly substrate and the transfer substrate is completed, a relative position of the transfer substrate with respect to the first assembly substrate and a relative position of the transfer substrate with respect to the second assembly substrate may be different from each other. However, the transfer substrate may shift the alignment position by a pitch of the sub pixel whenever the type of the assembly substrate changes. When the transfer substrate is sequentially pressed onto the first to third assembly substrates through the foregoing method, all three types of chips may be transferred to the transfer substrate.

Then, as shown in FIG. 11, a step of pressing the transfer substrate to the wiring substrate to transfer the semiconductor light-emitting devices emitting first to third colors from the transfer substrate to the wiring substrate is carried out.

According to the manufacturing method of FIG. 12, in order to manufacture a display device including a red chip, a green chip, and a blue chip, three types of assembly substrates and a single type of transfer substrate may be required.

Contrary to FIGS. 11 and 12 described above, according to FIG. 13, a red chip, a green chip, and a blue chip may be respectively assembled on one assembly substrate (RGB integrated template). In this state, the red chip, green chip, and blue chip may be respectively transferred to the wiring substrate by the same transfer substrate (RGB integrated stamp).

According to the manufacturing method of FIG. 13, in order to manufacture a display device including a red chip, a green chip, and a blue chip, a single type of assembly substrate and a single type of transfer substrate may be required.

When manufacturing a display device including semiconductor light-emitting devices emitting different colors as described above, the manufacturing method may be implemented in various ways.

The present disclosure relates to a substrate for manufacturing a display device for seating a semiconductor light-emitting device package in a self-assembled manner, and a method of manufacturing a display device using the substrate.

First, a structure of a semiconductor light-emitting device package constituting a display device according to the present disclosure will be described.

FIG. 14 is a conceptual view showing a structure of a semiconductor light-emitting device package in the related art.

The semiconductor light-emitting device package 1000P includes a plurality of electrodes 1200P and a plurality of semiconductor light-emitting devices 1300P connected to the plurality of electrodes 1200P. The plurality of electrodes 1200P and the plurality of semiconductor light-emitting devices 1300P are formed and disposed on a body portion 1100P made of a sapphire material.

According to the present disclosure, the semiconductor light-emitting device package 1000P has a size of several to several tens of μm, and may include semiconductor light-emitting devices 1300P emitting different colors. For example, the semiconductor light-emitting device package 1000P may be configured to include semiconductor light-emitting devices emitting red (R), green (G), and blue (B). In this case, one semiconductor light-emitting device package 1000P corresponds to one unit pixel.

The plurality of electrodes 1200P may be formed to pass through the body portion 1100P to be exposed in a predetermined shape on both sides thereof, and the semiconductor light-emitting devices 1300P may be disposed on an electrode exposed on either one of the both sides of the body portion 1100P. For example, as shown in (b) of FIG. 14, when a surface where the plurality of electrodes 1200P is exposed is referred to as one side of the body portion 1100P, the semiconductor light-emitting devices 1300P may be disposed on the electrodes exposed to the other side of the body portion 1100P. In this case, a conductive and adhesive material 1500P may be further disposed between the exposed electrode and the semiconductor light-emitting device 1300P as shown in (a) in FIG. 14.

The plurality of electrodes 1200P may be exposed in different shapes on both sides of the body portion 1100P. For example, when the semiconductor light-emitting device package 1000P includes the semiconductor light-emitting devices 1300P emitting red (R), green (G), and blue (B), the plurality of electrodes 1200P may be exposed in a shape as shown in (b) of FIG. 14 on one side of the body portion 1100P. In other words, the electrodes 1200P with one more than the number of semiconductor light-emitting devices 1300P may be exposed on one side of the body portion 1100P.

According to the present disclosure, four electrodes 1200P are exposed on one side of the body 1100P, and they correspond to an R electrode 1210P connected to an anode of a red semiconductor light-emitting device, a G electrode 1220P connected to an anode of a green semiconductor light-emitting device, a B electrode 1230P connected to an anode of a blue semiconductor light-emitting device, and a common electrode 1240P connected in common to a cathode of the red (R), green (G), and blue (B) semiconductor light-emitting devices, respectively.

On the other side of the body 1100P, six electrodes may be exposed so as to be respectively connected to the anode and cathode of the red, green, and blue semiconductor light-emitting devices, and among them, electrodes connected to the cathode of the red, green, and blue semiconductor light-emitting devices may be connected in common to the common electrode 1240P through an arbitrary pattern.

For example, a pattern connecting them may be formed on one side of the body portion 1100P. At this time, in order to electrically insulate the pattern and the electrodes 1200P exposed on one side of the body portion 1100P, the body portion 1100P may include an insulating layer 1400P covering the pattern on one side thereof. In this case, the plurality of electrodes 1200P may be formed to pass through the body portion 1100P and the insulating layer 1400P.

Meanwhile, according to the present disclosure, in order to implement the structure as described above, the semiconductor light-emitting devices 1300P included in the semiconductor light-emitting device package 1000P may be a flip chip type in which the first and second conductive electrodes are formed on the same surface of a specific semiconductor layer. However, the present disclosure is not limited thereto, and a horizontal or vertical type may also be applied thereto.

The semiconductor light-emitting device package 1000P in the related art has been transferred to an assembly substrate or a wiring substrate through a pick-and-place method. Since the pick-and-place method is performed by a manual operation, the assembly speed is very slow, and the precision and accuracy of the assembly are not constant.

Meanwhile, as a transfer process for replacing the pick-and-place method, there is a self-assembly method described above (see FIGS. 8A through 8E), but the structure of the semiconductor light-emitting device package 1000P in the related art according to FIG. 14 has a limit in uniformly aligning a plurality of electrodes 1200P having the same shape to the assembly substrate through self-assembly, and also, there is a problem that the substrate to which the existing individual semiconductor light-emitting devices are transferred through self-assembly cannot be applied as it is.

Hereinafter, in a display device using a semiconductor light-emitting device package, a substrate used to manufacture the display device and a method of manufacturing a display device using the substrate will be described.

First, a substrate for manufacturing a display device according to the present disclosure will be described with reference to FIGS. 15 to 17.

FIG. 15 is a cross-sectional view of a substrate for manufacturing a display device according to the present disclosure, and FIG. 16 is a view showing a substrate for manufacturing a display device and an electrode of a semiconductor light-emitting device package corresponding thereto according to an embodiment of the present disclosure, and FIG. 17 is a view showing a substrate for manufacturing a display device and an electrode of a semiconductor light-emitting device package corresponding thereto according to another embodiment of the present disclosure.

A substrate 2000 for manufacturing a display device according to the present disclosure, which is used to manufacture a display device using a semiconductor light-emitting device package 2000P, may be a substrate on which the semiconductor light-emitting device package 2000P is transferred through self-assembly, and a wiring electrode may not be formed thereon. Therefore, hereinafter, the substrate 2000 is referred to as an assembly substrate.

The semiconductor light-emitting device package 2000P including a plurality of electrodes 2200P and a plurality of semiconductor light-emitting devices 2300P connected to the electrodes 2200P is transferred to the assembly substrate 2000. The semiconductor light-emitting device package 2000P has a size of several to tens of μm, like the semiconductor light-emitting device package 1000P of FIG. 14, and may include semiconductor light-emitting devices emitting different colors. For example, the semiconductor light-emitting device package 2000P may be configured to include semiconductor light-emitting devices emitting red (R), green (G), and blue (B). Meanwhile, the semiconductor light-emitting device package 2000P constituting the display device according to the present disclosure has the same basic structure as that of the semiconductor light-emitting device package 1000P according to FIG. 14, and a detailed description thereof will be omitted.

The assembly substrate 2000 includes a base portion 2010, lower assembly electrodes 2020, a first insulating layer 2030, upper assembly electrodes 2040, a second insulating layer 2050, a cell 2060, and a partition wall portion 2070.

The base portion 2010 may be a base layer on which a structure of the substrate 2000 is formed. The base portion 2010 may be formed of an insulating material. In addition, the base portion 2010 may be a rigid substrate made of glass, quartz, or the like, or a flexible substrate containing a polymer material.

According to the present disclosure, the assembly substrate 2000 may include assembly electrodes separated vertically by the first insulating layer 2030. Specifically, the assembly substrate 2000 may include lower assembly electrodes 2020 formed on the base portion 2010 and upper assembly electrodes 2040 formed on the first insulating layer 2030, and the first insulating layer 2030 may be formed to cover the lower assembly electrodes 2020.

The lower assembly electrodes 2020 may extend in one direction, and may be disposed on the base portion 2010 at predetermined intervals. Furthermore, the upper assembly electrodes 2040 may extend in the same direction as the lower assembly electrodes 2020, and may be formed on the first insulating layer 2030 to overlap with the lower assembly electrodes 2020.

According to the present disclosure, the lower and upper assembly electrodes 2020, 2040 may form a group electrode between three adjacent assembly electrodes. The group electrode may denote assembly electrodes required to assemble one semiconductor light-emitting device package 2000P. Referring to FIG. 15, three adjacent lower assembly electrodes (first, second and third lower assembly electrodes) 2020a, 2020b, 2020c and upper assembly electrodes (first, second and third upper assembly electrodes) 2040a, 2040b, 2040c may respectively form a group electrode, and a total of 6 lower and upper assembly electrodes may be involved in assembling one semiconductor light-emitting device package 2000P.

In the lower assembly electrodes 2020, the group electrode may include first and second assembly electrodes 2020a, 2020c to which a first voltage signal is applied and a third assembly electrode 2020b to which a second voltage signal is applied. In this case, the third assembly electrode 2020b to which a different voltage signal is applied may be disposed between the first and second assembly electrodes 2020a, 2020c to which the same voltage signal is applied. Accordingly, an electric field may be formed between the first and third assembly electrodes 2020a, 2020c and between the second and third assembly electrodes 2020b, 2020c. The same is also applied to a group electrode of the upper electrodes 2040.

Meanwhile, since the first voltage signal and the second voltage signal do not mean signals having a specific polarity, both + or − voltage signals may be applied to the first to third assembly electrodes. In other words, when a + voltage signal is applied to the first and second assembly electrodes, a − voltage signal is applied to the third assembly electrode, and when a − voltage signal is applied to the first and second assembly electrodes, a + voltage signal may be applied to the third assembly electrode. According to an embodiment of the present disclosure, + and − signals may be alternately applied to the first and second assembly electrodes and the third assembly electrode, respectively.

In this way, since a voltage signal for forming an electric field is applied to the lower and upper assembly electrodes 2020, 2040, the assembly electrodes 2020, 2040 may be formed of a resistive metal corresponding to any one of Al, Mo, Cu, Ag, and Ti, or an alloy selected from them. However, the present disclosure is not limited thereto, and any material suitable for transmitting electrical signals may be used.

According to the present disclosure, the first to third assembly electrodes 2040a, 2040b, 2040c corresponding to a group electrode of the upper assembly electrodes 2040 may be formed to overlap with the first to third assembly electrodes 2020a, 2020b, 2020c corresponding to a group electrode of the lower assembly electrodes 2020.

In addition, the first to third assembly electrodes 2040a, 2040b, 2040c forming a group electrode of the upper assembly electrodes 2040 may be formed at a larger interval than the first to third assembly electrodes 2020a, 2020b, 2020c forming a group electrode of the lower assembly electrodes 2020. For example, the assembly electrodes 2020, 2040 may be formed at intervals of several to several hundreds of μm, and intervals between the lower assembly electrodes 2020 and the upper assembly electrodes 2040 may be determined within the relevant range.

The lower assembly electrodes 2020 may be formed to include the protruding portion to have a smaller interval than the upper assembly electrodes 2040. Specifically, the first and second assembly electrodes 2020a, 2020c in a group electrode of the lower assembly electrodes 2020 may respectively include first and second protruding portions 2021, 2022 protruding toward the third assembly electrode 2020b, and the third assembly electrode 2020b may include a third protruding portion 2023 protruding toward the first assembly electrode 2020a and a fourth protruding portion 2024 protruding toward the second assembly electrode 2020c. At this time, the first protruding portion 2021 and the third protruding portion 2023, and the second protruding portion 2022 and the fourth protruding portion 2024 may be disposed to face each other.

Meanwhile, a second insulating layer 2050 may be deposited on the upper assembly electrodes 2040. The second insulating layer 2050 may be deposited on the first insulating layer 2030 to cover the upper assembly electrodes 2040 while forming a plurality of holes 2051 to 2054, including 2051, 2052, 2053 and 2054 in which the plurality of electrodes 2200P of the semiconductor light-emitting device package 2000P are accommodated. The plurality of holes 2051 to 2054 may be formed at a height of several to tens of μm.

The partition wall portion 2070 may be deposited on the second insulating layer 2050. The partition wall portion 2070 may be deposited on the second insulating layer 2050 while forming the cell 2060 in which the semiconductor light-emitting device package 2000P is accommodated. The cell 2060 may be formed at a height of several to several hundred μm.

The cell 2060 in which the semiconductor light-emitting device package 2000P is accommodated may be formed to include holes 2051 to 2054 in which a plurality of electrodes 2200P included in the semiconductor light-emitting device package 2000P are accommodated while being formed to overlap with the lower and upper assembly electrodes 2020, 2040 forming an electric field. According to the present disclosure, since the semiconductor light-emitting device package 2000P includes four electrodes 2210P to 2240P, it may be formed to include four holes 2051 to 2054 in one cell 2060.

The holes 2051 to 2054 included in the cell 2060 may be formed to correspond to the electrodes 2200P to accommodate respective electrodes 2200P included in the semiconductor light-emitting device package 2000P.

In addition, the holes 2051 to 2054 may be formed to overlap with the lower assembly electrodes 2020 forming an electric field, in detail, the first assembly electrode 2020a and the third assembly electrode 2020b or the second assembly electrode 2020c and the third assembly electrode 2020b forming a group electrode of the lower assembly electrodes 2020. At this time, the holes 2051 to 2054 may overlap with the protruding portions 2021 to 2024 of the first to third assembly electrodes 2020a to 2020c.

As described above, the cell 2060 in which the semiconductor light-emitting device package 2000P is accommodated and the plurality of holes 2051 to 2054 in which the plurality of electrodes 2200P included in the semiconductor light-emitting device package 2000P are accommodated may be formed to overlap with the lower and/or upper assembly electrodes 2020, 2040, thereby maximizing the effect of the electric field.

Referring to FIGS. 16 and 17, the holes 2051 to 2054 included in the cell 2060 may respectively include holes formed to have at least one of a different shape and size. This may be formed to correspond to the electrodes 2210P to 2240P included in the semiconductor light-emitting device package 2000P. In other words, the semiconductor light-emitting device package 2000P transferred to the assembly substrate 2000 according to the present disclosure may include a plurality of electrodes 2210P to 2240P formed to have at least one of a different shape and size. Accordingly, the plurality of electrodes 2210P to 2240P included in the semiconductor light-emitting device package 2000P may be seated in the holes 2051 to 2054 formed to correspond thereto through self-assembly.

According to an embodiment of the present disclosure, the holes 2051 to 2054 included in the cell 2060 may include two pairs of pair holes (A, B) having the same shape and size. This means that the electrodes 2200P included in the semiconductor light-emitting device package 2000P are also configured with two pairs of pair electrodes having the same shape and size. The two pairs of pair holes (A, B) may be respectively disposed along an extension direction of the lower and upper assembly electrodes 2020, 2040.

On the other hand, when there exist holes of a shape extending (a+b) in a specific direction among the holes 2051 to 2054 included in the cell 2060 (pair holes B in FIG. 16, pair holes A in FIG. 17), the relevant holes may be disposed such that the extension direction of the relevant holes and the extension direction of the lower and upper assembly electrodes 2020, 2040 are identical to each other. This structure may maximize the effect of an electric field acting in the holes 2051 to 2054. Meanwhile, among the holes 2051 to 2054 included in the cell 2060, holes having a shape extending in a specific direction may be formed in a length larger by several to several hundred μm than that of the remaining holes in the extension direction.

Meanwhile, contrary to the accompanying drawings, the holes 2051 to 2054 and the electrodes 2210P to 2240P may all have different sizes or shapes, and in this case, the pair holes and the pair electrodes may not exist.

In this way, the plurality of electrodes 2200P included in the semiconductor light-emitting device package 2000P and the holes 2051 to 2054 of the assembly substrate 2000 formed to correspond thereto are all formed in different shapes and sizes, or formed to include two different pairs of pair electrodes and pair holes, and thus there is an effect of allowing the semiconductor light-emitting device package 2000P to be aligned in a predetermined direction even by self-assembly. In particular, an embodiment including pair electrodes and pair holes has an effect of facilitating a pattern formation process for forming the electrodes and the holes.

Meanwhile, the first and second insulating layers 2030 and 2050 of the assembly substrate 2000 may be made of an inorganic insulating material such as $SiO_2$, $SiN_X$, SiON, $Al_2O_3$, $TiO_2$ or $HfO_2$, and the first and second insulating layers 2030, 2050 may be formed of the same material or formed of different materials. In addition, the partition wall portion 2070 may be formed of a polymer material such as PAC or PI, or an inorganic insulating material such as $SiO_2$ or $SiN_X$.

Next, a method for manufacturing a display device using the substrate for manufacturing the display device according to the present disclosure will be described with reference to FIG. 18.

FIG. 18 is a conceptual view for explaining a method of manufacturing a display device according to the present disclosure. The semiconductor light-emitting device package 2000P shown in FIG. 18 is provided for convenience of description, and may be different from an actual structure.

First, a step (a) of manufacturing a semiconductor light-emitting device package 2000P including a plurality of electrodes 2200P and a plurality of semiconductor light-emitting devices 2300P connected to the electrodes 2200P may be performed. Specifically, semiconductor light-emitting devices emitting red (R), green (G), and blue (B) may be grown on separate growth substrates, respectively, and then the semiconductor light-emitting devices may be bonded onto the body portion 2100P made of sapphire material and having an insulating layer 2400P. At this time, the semiconductor light-emitting devices 2300P bonded to the semiconductor light-emitting device package 2000P may be a flip chip type in which first and second conductive electrodes are formed on the same surface of a specific semiconductor layer. However, the present disclosure is not limited thereto, and a horizontal or vertical type may also be applied thereto.

According to the present disclosure, since the semiconductor light-emitting devices 2300P are not directly assembled on the assembly substrate 2000, the semiconductor light-emitting devices 2300P need not to have a symmetrical structure for self-assembly or include a magnetic material.

Meanwhile, the plurality of electrodes 2200P included in the semiconductor light-emitting device package 2000P according to the present disclosure may include a magnetic material to be guided by a magnetic field during self-assembly. In addition, the electrodes 2200P may be manufactured to have at least one of a different shape and size. Preferably, it may be manufactured to include two pairs of pair electrodes having the same shape and size. Other structures of the semiconductor light-emitting device package 2000P will be replaced with the foregoing description.

Next, a step (b) of placing the semiconductor light-emitting device package 2000P into a fluid chamber, and moving a substrate including the assembly electrodes 2020, 2040 to which the semiconductor light-emitting device package 2000P is to be transferred to a predetermined position may be performed.

In this step, the substrate to which the semiconductor light-emitting device package 2000P is to be transferred may be a substrate (or assembly substrate) 2000 for manufacturing a display device according to the present disclosure. The assembly substrate 2000 may be disposed above the fluid chamber while an assembly surface to which the semiconductor light-emitting device packages 2000P are transferred faces a bottom surface of the fluid chamber.

The assembly surface of the assembly substrate 2000 may include structures for self-assembling the semiconductor light-emitting device package 2000P including the assembly electrodes 2020, 2040. According to the present disclosure, the assembly surface may include assembly electrodes 2020, 2040 having a separated structure. Specifically, the assembly surface may include lower assembly electrodes 2020 and upper assembly electrodes 2040 separated by the first insulating layer 2030. Furthermore, the lower and upper assembly electrodes 2020, 2040 may form a group electrode between three adjacent assembly electrodes. The lower assembly electrodes 2020 and the upper assembly electrodes 2040 illustrated in FIG. 18 may form a single group electrode. The group electrode may denote assembly electrodes required to assemble one semiconductor light-emitting device package 2000P. A detailed description thereof will be replaced with the foregoing description.

Meanwhile, the assembly substrate 2000 may include the second insulating layer 2050 deposited on the first insulating layer 2030 to cover the upper electrodes 2040 while forming a plurality of holes 2051 to 2054 in which the plurality of electrodes 2200P included in the semiconductor light-emitting device package 2000P are accommodated, and the partition wall portion 2070 deposited on the second insulating layer 2050 while forming the cells 2060 in which the semiconductor light-emitting device package 2000P is accommodated.

The holes 2051 to 2054 may be formed to correspond to the plurality of electrodes 2210P to 2240P, respectively, and the cell 2060 may be formed in a shape corresponding to the body portion 2100P of the semiconductor light-emitting device package 2000P. Furthermore, the cell 2060 may be formed to include the holes 2051 to 2054.

In addition, the holes 2051 to 2054 may overlap with the lower assembly electrodes 2020 to form an electric field in the holes 2051 to 2054, and the cell 2060 may be formed to overlap with the lower assembly electrodes 2020 and the upper assembly electrodes 2040 to form an electric field therein.

Next, a step (c) of applying a magnetic force to move the semiconductor light-emitting device package in the fluid chamber may be performed. At this time, the magnetic force may be formed by a magnet disposed on a side opposite to the assembly surface of the assembly substrate 2000, and the semiconductor light-emitting device package 2000P may be guided by the magnetic force to rise toward the assembly surface, that is, in a direction opposite to gravity. Furthermore, the semiconductor light-emitting device package 2000P may move together along a direction in which the magnet moves.

Finally, a step (d) of applying a voltage to the assembly electrodes 2020, 2040 to form an electric field, and guiding and seating the semiconductor light-emitting device package 2000P in the fluid chamber to a predetermined position on the assembly substrate 2000 may be performed. In this step, an electric field may be formed on an assembly surface of the assembly substrate 2000, and in particular, may be more strongly formed in the cell 2060 and the holes 2051 to 2054 overlapping with the assembly electrodes 2020, 2040.

Specifically, this step may include a step of guiding the semiconductor light-emitting device package 2000P into the cell 2060 (a first assembly step), and a step of aligning the semiconductor light-emitting device package 2000P to allow the electrodes 2200P of the semiconductor light-emitting device package 2000P guided into the cell 2060 to be accommodated in the corresponding holes 2051 to 2054 formed in the assembly substrate 2000 (a second assembly step).

The first assembly step may be a step in which the semiconductor light-emitting device package 2000P guided to the assembly surface by a magnetic force is guided into the cell 2060 by an electric field formed in the cell 2060. At this time, the semiconductor light-emitting device package 2000P is in a state of being accommodated in the cell 2060, but not in a state that the plurality of electrodes 2200P included in the semiconductor light-emitting device package 2000P are not aligned inside the holes 2051 to 2054.

The secondary assembly step may be a step in which the plurality of electrodes 2200P are seated in the holes 2051 to 2054 formed to correspond thereto, respectively, by a flow velocity and an electric field inside the cell 2060. The semiconductor light-emitting device package 2000P accommodated in the cell 2060 may be assembled in the holes 2051 to 2054 formed to correspond to the plurality of electrodes 2210P to 2240P while rotating under the influence of the flow velocity and the electric field inside the cell 2060.

According to the present disclosure, the substrate 2000 for manufacturing a display device has a structure in which the semiconductor light-emitting device package 2000P composed of the plurality of electrodes 2200P and the semiconductor light-emitting devices 2300P can be uniformly aligned. As a result, according to the present disclosure, a semiconductor light-emitting device 2000P that has been transferred by a pick-and-place method in the related art may be allowed to be transferred through self-assembly, thereby having an effect of improving process efficiency (improving process speed and reducing time).

The present disclosure described above will not be limited to configurations and methods according to the above-described embodiments, and all or part of each embodiment may be selectively combined and configured to make various modifications thereto.

The invention claimed is:

1. A display device manufacturing substrate used to manufacture a display device including a semiconductor light-emitting device package comprising a plurality of electrodes and a plurality of semiconductor light-emitting devices connected to the electrodes, the substrate comprising:
   a base portion;
   lower assembly electrodes extending in one direction, and on the base portion;
   a first insulating layer to cover the lower assembly electrodes;
   upper assembly electrodes extending in a same direction as the lower assembly electrodes, and on the first insulating layer to overlap with the lower assembly electrodes;
   a second insulating layer on the first insulating layer to cover the upper assembly electrodes and including a plurality of holes configured to accommodate electrodes of the semiconductor light-emitting device package; and
   a partition wall portion on the second insulating layer and forming a cell configured to accommodate the semiconductor light-emitting device package,
   wherein the cell comprises the plurality of holes in the cell, and
   wherein, at the holes, the second insulating layer contacts the first insulating layer.

2. The substrate of claim 1, wherein the plurality of holes included in the cell correspond to the electrodes included in the semiconductor light-emitting device package, respectively.

3. The substrate of claim 2, wherein the plurality of holes included in the cell comprise holes formed to be different in at least one of shape and size from each other.

4. The substrate of claim 3, wherein the plurality of holes included in the cell comprise two pairs of pair holes having a same shape and size, and
   wherein the two pairs of pair holes are disposed along an extension direction of the lower and upper assembly electrodes.

5. The substrate of claim 3, wherein an extension direction of the plurality of holes is identical to that of the lower and upper assembly electrodes.

6. The substrate of claim 1, wherein the lower and upper assembly electrodes form a group electrode between three adjacent assembly electrodes, and
   wherein the cell is formed to overlap with the group electrode of the lower and upper assembly electrodes at the same time.

7. The substrate of claim 6, wherein the group electrode of the lower and upper assembly electrodes comprises:
   a first assembly electrode and a second assembly electrode to which a first voltage signal is applied; and
   a third assembly electrode to which a second voltage signal is applied, and
   wherein the third assembly electrode is disposed between the first assembly electrode and the second assembly electrode.

8. The substrate of claim 7, wherein the first assembly electrode and the second assembly electrode in the group electrode of the lower assembly electrodes respectively comprise a first protruding portion and a second protruding portion protruding toward the third assembly electrode, and
   wherein the third assembly electrode comprises a third protruding portion protruding toward the first assembly electrode and a fourth protruding portion protruding toward the second assembly electrode.

9. The substrate of claim 7, wherein the first, second and third assembly electrodes corresponding to the group electrode of the upper assembly electrodes are respectively formed to overlap with the first, second and third assembly electrodes corresponding to the group electrode of the lower assembly electrodes.

10. The substrate of claim 7, wherein the plurality of holes are respectively formed to overlap with the first assembly electrode and the third assembly electrode or the second assembly electrode and the third assembly electrode that form the group electrode of the lower assembly electrodes.

11. The substrate of claim 7, wherein the first, second and third assembly electrodes forming the group electrode of the upper assembly electrodes are formed at a larger interval than the first, second and third assembly electrodes forming the group electrode of the lower assembly electrodes.

12. A method of manufacturing a display device, the method comprising:
   manufacturing a semiconductor light-emitting device package comprising a plurality of electrodes and a plurality of semiconductor light-emitting devices connected to the plurality of electrodes;
   placing the semiconductor light-emitting device package into a fluid chamber, and moving a substrate comprising assembly electrodes to which the semiconductor light-emitting device package is to be transferred to a predetermined position relative to the fluid chamber;
   applying a magnetic force to move the semiconductor light-emitting device package in the fluid chamber; and
   applying a voltage to the assembly electrodes to form an electric field, and guiding and seating the semiconductor light-emitting device package in the fluid chamber to a predetermined position on the substrate,
   wherein the substrate comprises:
   a base portion;
   lower assembly electrodes extending in one direction, and on the base portion;
   a first insulating layer to cover the lower assembly electrodes;
   upper assembly electrodes extending in a same direction as the lower assembly electrodes, and on the first insulating layer to overlap with the lower assembly electrodes;
   a second insulating layer on the first insulating layer to cover the upper assembly electrodes, and including a plurality of holes configured to accommodate electrodes of the semiconductor light-emitting device package; and
   a partition wall portion on the second insulating layer and forming a cell configured to accommodate the semiconductor light-emitting device package, and
   wherein the cell comprises the plurality of holes.

13. The method of claim 12, wherein in the manufacturing the semiconductor light-emitting device package, the plurality of electrodes included in the semiconductor light-emitting device package are manufactured to be different in at least one of shape and size, and wherein holes of the substrate configured to accommodate the plurality of electrodes are formed to correspond to the plurality of electrodes.

14. The method of claim 13, wherein the applying the voltage to the assembly electrodes comprises:

guiding the semiconductor light-emitting device package into the cell; and aligning the semiconductor light-emitting device package to allow the plurality of electrodes of the semiconductor light-emitting device package guided into the cell to be accommodated correspondingly in the holes of the substrate.

15. The method of claim 13, wherein the holes have at least one of shape and size to correspond to those of the plurality of electrodes, respectively.

16. The method of claim 12, wherein the substrate further includes an insulating layer covering the assembly electrodes, wherein the holes configured to accommodate the plurality of electrodes of the semiconductor light-emitting device package are formed in the insulating layer.

17. A substrate used to manufacture a display device, the substrate comprising:

a base portion;

assembly electrodes on the base portion;

an insulating layer covering the assembly electrodes; and a partition wall on the insulating layer, and having a cell configured to accommodate a semiconductor light-emitting device package, wherein the insulating layer includes holes configured to accommodate electrodes of the semiconductor light-emitting device package, wherein one assembly electrode among the assembly electrodes is positioned between adjacent holes of the holes, wherein the insulating layer includes a first insulating layer on the base portion, and a second insulating layer on the first insulating layer, and wherein, at the holes, the second insulating layer contacts the first insulating layer.

18. The substrate of claim 17, wherein the assembly electrodes include a plurality of lower assembly electrodes on the base portion, and a plurality of upper assembly electrodes on the lower assembly electrodes, and wherein the holes are interposed between the plurality of upper assembly electrodes.

* * * * *